United States Patent
Shimizu et al.

(10) Patent No.: US 7,248,534 B2
(45) Date of Patent: Jul. 24, 2007

(54) SEMICONDUCTOR MEMORY DEVICE

(75) Inventors: Hiroshi Shimizu, Kawasaki (JP); Wataru Yokozeki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/312,586

(22) Filed: Dec. 21, 2005

(65) Prior Publication Data

US 2006/0098517 A1    May 11, 2006

Related U.S. Application Data

(62) Division of application No. 11/055,969, filed on Feb. 14, 2005, now Pat. No. 7,016,238, which is a division of application No. 10/199,070, filed on Jul. 22, 2002, now Pat. No. 6,870,788.

(30) Foreign Application Priority Data

Nov. 9, 2001 (JP) ............................. 2001-344491

(51) Int. Cl.
 *G11C 8/00* (2006.01)
(52) U.S. Cl. ................ 365/230.03; 365/154; 365/156; 365/189.01; 365/230.08
(58) Field of Classification Search .......... 365/230.03, 365/154, 156, 189.01, 230.08
See application file for complete search history.

(56) References Cited

U.S. PATENT DOCUMENTS

| 5,563,820 A | 10/1996 | Wada et al. |
| 5,671,188 A | 9/1997 | Patel et al. |
| 5,748,547 A | 5/1998 | Shau |
| 5,805,501 A | 9/1998 | Shiau et al. |
| 5,929,832 A | 7/1999 | Furukawa et al. |
| 5,953,261 A | 9/1999 | Furutani et al. |
| 5,991,223 A | 11/1999 | Kozaru et al. |
| 6,097,660 A | 8/2000 | Tsuchida et al. |
| 6,128,217 A * | 10/2000 | Serizawa ..................... 365/154 |
| 6,301,154 B1 | 10/2001 | Sumitani |

(Continued)

FOREIGN PATENT DOCUMENTS

JP    2000-207886    7/2000

OTHER PUBLICATIONS

Lower-Power High-Speed LSI Circuit & Technology, Sipec Corp., p. 187 (1998).

*Primary Examiner*—Connie C. Yoha
(74) *Attorney, Agent, or Firm*—Arent Fox LLP

(57) ABSTRACT

A semiconductor memory device that speeds up its operation. A multiplexer puts one of word lines into an active state to select one memory cell in each local block. Another multiplexer puts one of local block selection signals into an active state and puts one of p-channel transistors into the ON state to select one of local blocks arranged in a column direction. A NAND element inverts the logical product of a signal output from a local block selected by a local block selection signal and a signal output from a block not selected and outputs a result obtained to put an n-channel transistor into the ON or OFF state. The n-channel transistor grounds a common bit line when it goes into the ON state. Each of the p-channel transistors is selected by a column switch (not shown) and send read data to a data bus.

1 Claim, 18 Drawing Sheets

U.S. PATENT DOCUMENTS 6,304,509 B1 10/2001 Hirobe et al.
6,314,042 B1 11/2001 Tomishima et al.
6,327,214 B1 12/2001 Yoon et al.
6,351,427 B1 2/2002 Brown
6,366,512 B1 * 4/2002 Yeh et al. .................. 365/203
6,388,936 B2 5/2002 Itoh et al.
6,839,268 B2 * 1/2005 Osada et al. ................ 365/156

* cited by examiner

|  | W0 | W1 |
|---|---|---|
| AT THE TIME OF WRITING | H | L |
|  | L | H |
| AT THE TIME OF READING | L | L |

FIG. 17

SEMICONDUCTOR MEMORY DEVICE

This is a Division of application Ser. No. 11/055,969 now U.S. Pat. No. 7,016,238 filed Feb. 14, 2005, which is a Divisional of application Ser. No. 10/199,070 now U.S. Pat. No. 6,870,788 filed Jul. 22, 2002. The disclosure of the prior application(s) is hereby incorporated by reference herein in its entirety.

BACKGROUND OF THE INVENTION (1) Field of the Invention

This invention relates to a semiconductor memory device and, more particularly, to a semiconductor memory device in which memory cells arranged in a column direction are divided into a plurality of local blocks and in which data is read or written by the local block.

(2) Description of the Related Art

Bit line hierarchy systems which enable a reduction of power consumption and high-speed processing in random access memories (RAMs) have been proposed. With these bit line hierarchy systems, a memory array is divided into a plurality of banks. A divided bit line in each bank is actually connected to a memory cell. A common bit line is located parallel to this divided bit line over each bank. A common bit line is not connected to a memory cell, so its load capacitance per unit length is smaller than that of a divided bit line. Therefore, compared with cases where bit lines are not hierarchized, these bit line hierarchy systems enable high-speed low-power read/write operation.

Conventional bit line hierarchy systems are disclosed in, for example, *Low-power High-speed LSI Circuits & Technology*, Sipec Corp. (the former Realize Inc.), 1998, p. 187, and Japanese Patent Laid-Open Publication No. 2000-207886.

FIG. 18 shows an example of a block diagram of a static RAM (SRAM) in which a bit line division system is adopted. As shown in FIG. 18, a conventional SRAM comprises a timing control circuit 1, a row decoder 2, a word line driver 3, a bank decoder 4, a column decoder 5, banks B1 through Bn, pre-charge circuits PC1 through PCp, column switches CS1 through CSp, and an I/O circuit 6.

The timing control circuit 1 inputs an address signal, clock signal, and control signal and controls the row decoder 2, bank decoder 4, column decoder 5, and pre-charge circuits PC1 through PCp on the basis of these signals.

The row decoder 2 decodes a row input address signal supplied from the timing control circuit 1, controls the word line driver 3 according to the result, and selects predetermined memory cell groups in a row direction.

The column decoder 5 decodes a column input address signal supplied from the timing control circuit 1, controls the column switches CS1 through CSp according to the result, and selects predetermined memory cell groups.

The word line driver 3 selects predetermined memory cell groups in the row direction under the control of the row decoder 2.

Under the control of the timing control circuit 1 the bank decoder 4 controls bank control circuits BC1 through BCp included in each of the banks B1 through Bn for selecting them.

Each of the banks B1 through Bn includes a memory cell group divided by predetermined numbers (m's, in this example) in a column direction. When data is read or written, predetermined memory cells are selected by the word line driver 3. These memory cells are connected to the corresponding divided bit lines BL11 through BLp1, respectively, and are connected to the corresponding auxiliary divided bit lines BLX11 through BLXp1 respectively. Furthermore, predetermined banks are selected by the bank control circuits BC1 through BCp. These banks are connected to common bit lines GBL1 through GBLp, respectively, and are connected to auxiliary common bit lines GBLX1 through GBLXp respectively.

Memory cells (MCs) C11 through C1m, . . . , and Cp1 through Cpm are the smallest units that store data.

The bank control circuits BC1 through BCp go into the ON or OFF state under the control of the bank decoder 4 to connect the divided bit lines BL11 through BLp1 to the common bit lines GBL1 through GBLp, respectively, and to connect the auxiliary divided bit lines BLX11 through BLXp1 to the auxiliary common bit lines GBLX1 through GBLXp respectively.

The pre-charge circuits PC1 through PCp perform the pre-charge operation of supplying electric charges to the common bit lines GBL1 through GBLp and auxiliary common bit lines GBLX1 through GBLXp, which have lost electric charges, under the control of the timing control circuit 1 after read operation is completed.

The column switches CS1 through CSp go into the ON or OFF state under the control of the column decoder 5 to connect one of the common bit lines GBL1 through GBLp corresponding to a predetermined column to a data bus DB and to connect one of the auxiliary common bit lines GBLX1 through GBLXp corresponding to the predetermined column to an auxiliary data bus DBX.

The I/O circuit 6 includes a sense amplifier, write amplifier, and input-output circuit. The I/O circuit 6 amplifies read data with the sense amplifier and outputs it. Moreover, the I/O circuit 6 amplifies input data with the write amplifier and sends it to the data bus DB and auxiliary data bus DBX.

FIG. 18 shows the details of the bank B1 alone. The structure of the banks B2 through Bn is the same as that of the bank B1.

Now, operation in the above conventional SRAM will be described.

First, descriptions will be given with a case where data is read from the memory cell C11 as an example. When an address from which data is to be read is input to the timing control circuit 1, the timing control circuit 1 supplies a predetermined control signal to the row decoder 2, bank decoder 4, and column decoder 5 on the basis of this address.

The row decoder 2 decodes the row input address signal supplied from the timing control circuit 1 and informs the word line driver 3 about which word line the word line driver 3 should select.

The word line driver 3 puts a predetermined word line into an active state under the control of the row decoder 2. In this example, data is to be read from the memory cell C11, so a word line connected to the memory cells C11 through Cp1 is put into an active state and the other word lines are put into an inactive state.

Then data will be read from the memory cells C11 through Cp1 and output voltage will be applied to the divided bit lines BL11 through BLp1 and auxiliary divided bit lines BLX11 through BLXp1.

The bank decoder 4 puts all the bank control circuits BC1 through BCp included in the bank B1 into the ON state. As a result, the divided bit lines BL11 through BLp1 included in the bank B1 are connected to the common bit lines GBL1 through GBLp, respectively, and the auxiliary divided bit lines BLX11 through BLXp1 included in the bank B1 are connected to the auxiliary common bit lines GBLX1 through GBLXp respectively. Therefore, data stored in the memory cell C11 is supplied to the common bit line GBL1 and auxiliary common bit line GBLX1. In this case, the bank control circuits BC2 through BCp also go into the ON state, so data stored in the memory cells C21 through Cp1 is read and is output to the common bit lines GBL2 through GBLp, respectively, and to the auxiliary common bit lines GBLX2 through GBLXp respectively.

The column decoder 5 decodes the column input address signal supplied from the timing control circuit 1 and puts one of the column switches CS1 through CSp which corresponds to the result into the ON state. In this example, data stored in the memory cell C11 is to be read, so the column switch CS1 goes into the ON state and the others go into the OFF state.

Data output from the column switch CS1 is supplied to the I/O circuit 6 via the data bus DB and auxiliary data bus DBX.

The I/O circuit 6 increases the voltage of the data read in this way to a predetermined value with the built-in sense amplifier and outputs it.

The operation of reading data stored in another memory cell is performed in the same way as described above, so descriptions of it will be omitted. The operation of writing data into a memory cell is performed in the same way as described above, except that data is read from the I/O circuit 6 side and is supplied to a memory cell. Therefore, descriptions of it will also be omitted.

As stated above, compared with cases where bit lines are not hierarchized, the above bit line hierarchy system enables the provision of high-speed low-power semiconductor memories.

However, in recent years semiconductor memories which operate at higher speed are needed because the amount of information treated by information processing units has increased by leaps and bounds. Moreover, the miniaturization of portable information processing units is greatly needed, so the area of chips used in semiconductor memories must also be made smaller.

SUMMARY OF THE INVENTION

The present invention was made under the background circumstances as described above. An object of the present invention is to provide a miniature low-power semiconductor memory device.

In order to achieve the above object, a semiconductor memory device in which memory cells arranged in a column direction are divided into a plurality of local blocks and in which data is read or written by the local block is provided. This semiconductor memory device comprises word lines shared by part or all of the plurality of local blocks arranged in the column direction, a first selection circuit for controlling the word lines to select predetermined memory cells one at a time from each local block, a second selection circuit for selecting one predetermined local block from the plurality of local blocks which are arranged in the column direction and which share the word lines, and a third selection circuit for selecting a predetermined local block from a plurality of local blocks which are arranged in a row direction and which are selected by the second selection circuit.

Moreover, in order to achieve the above object, a semiconductor memory device in which memory cells arranged in a column direction are divided into a plurality of local blocks and in which memory cells are controlled by control circuits located according to the local blocks to read or write data is provided. In this semiconductor memory device, each of the control circuits shares the same well with an adjacent memory cell.

Furthermore, in order to achieve the above object, a semiconductor memory device in which memory cells arranged in a column direction are divided into a plurality of local blocks and in which data is read or written by the local block is provided. In this semiconductor memory device, each local block has a write amplifier circuit for writing data into a memory cell which includes a first transistor, to an input terminal of which a first write signal line is connected, a first output terminal of which is grounded, and a second output terminal of which is connected to a first terminal of a memory cell included in the local block, a second transistor, to an input terminal of which a second write signal line is connected, a first output terminal of which is grounded, and a second output terminal of which is connected to a second terminal of a memory cell included in the local block, a third transistor, a first output terminal of which is connected to the second output terminal of the first transistor, a second output terminal of which is connected to power supply, and an input terminal of which is connected to the input terminal of the second transistor, and a fourth transistor, a first output terminal of which is connected to the second output terminal of the second transistor, a second output terminal of which is connected to the power supply, and an input terminal of which is connected to the input terminal of the first transistor.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIG. 17 is a view for describing the operation of the embodiment shown in FIG. 16.

DESCRIPTION OF THE PREFERRED EMBODIMENTS

Embodiments of the present invention will now be described with reference to the drawings.

Figure 1:
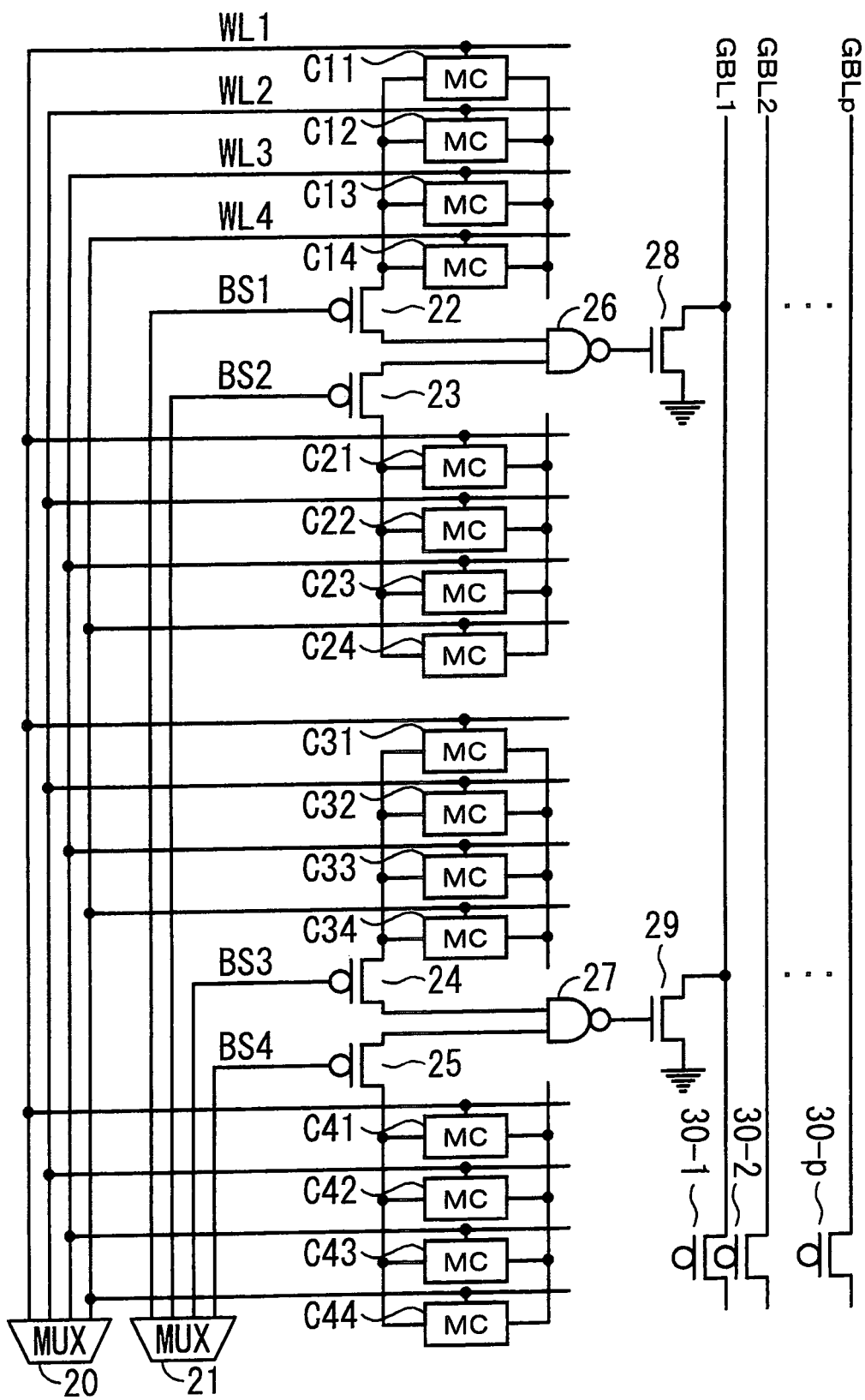
FIG. 1 is a view showing the structure of a first embodiment of the present invention.

FIG. 1 is a view showing the structure of a first embodiment of the present invention. The basic structure of the first embodiment is the same as that of the conventional semiconductor memory device shown in FIG. 18, so only the main portions of the first embodiment are shown in FIG. 1.

As shown in FIG. 1, the first embodiment of the present invention comprises memory cells C11 through C14, C21 through C24, C31 through C34, and C41 through C44, multiplexers 20 and 21, p-channel transistors 22 through 25, NAND elements 26 and 27, n-channel transistors 28 and 29, and p-channel transistors 30-1 through 30-p.

The memory cells C11 through C14 form a local block (bank). The same applies to the memory cells C21 through C24, C31 through C34, and C41 through C44. In this example, only a column of memory cells are shown. But in reality there are p columns of memory cells.

Memory cells included in each local block are connected to one another. In this example, output from the left terminal of each memory cell is input to the source or drain of the p-channel transistor 22, 23, 24, or 25.

The multiplexer 20 decodes an address signal supplied from a timing control circuit 1 or a row decoder 2, selects one of word lines WL1 through WL4 which corresponds to the address signal, and puts it into an active state.

The multiplexer 21 decodes an address signal supplied from the timing control circuit 1 or a bank decoder 4 and puts one of local block selection signals BS1 through BS4 which corresponds to the address signal into an active state for the purpose of selecting a predetermined local block.

The p-channel transistors 22 through 25 go into the ON or OFF state according to the local block selection signals BS1 through BS4, respectively, supplied from the multiplexer 21.

The NAND element 26 inverts the logical product of signals output from the p-channel transistors 22 and 23 and outputs a result obtained.

The NAND element 27 inverts the logical product of signals output from the p-channel transistors 24 and 25 and outputs a result obtained.

The n-channel transistor 28 goes into the ON or OFF state according to output from the NAND element 26. When the n-channel transistor 28 goes into the ON state, a common bit line GBL1 is grounded.

The n-channel transistor 29 goes into the ON or OFF state according to output from the NAND element 27. When the n-channel transistor 29 goes into the ON state, the common bit line GBL1 is grounded.

The p-channel transistors 30-1 through 30-p are controlled by column switches CS1 through CSp respectively. When the corresponding column switches go into the ON state, these transistors also go into the ON state and the common bit lines GBL1 through GBLp are connected to a data bus DB.

The above circuit is for one column. There are p columns, so a total of p circuits each of which is the same as the circuit shown in FIG. 1 will be located.

Now, operation in the above first embodiment of the present invention will be described.

Descriptions will be given with a case where data is read from the memory cell C11 as an example.

First, when an address signal is supplied to the multiplexer 20, the multiplexer 20 decodes this address signal and puts the corresponding word line into an active state. In this example, data stored in the memory cell C11 is to be read, so the word line WL1 goes into an active state.

The word line WL1 is connected to the first memory cells (memory cells C11, C21, C31, and C41) in all of the local blocks, so not only the memory cell C11 but also the memory cells C21, C31, and C41 will be selected. As a result, data stored in these memory cells will be read.

Next, by decoding the address signal supplied, the multiplexer 21 puts a local block selection signal for selecting a local block including a memory cell from which data is to be read into an active state. In this example, data stored in the memory cell C11 is to be read, so the local block selection signal BS1 goes into an active state. As a result, the p-channel transistor 22 goes into the ON state and a signal read from the memory cell C1 is supplied to an upper input terminal of the NAND element 26.

If data stored in the memory cell C11 is "H," then "H" is supplied to the NAND element 26. Both input terminals of the NAND element 26 have been pulled up to the "H" level by resistors (not shown). Therefore, the lower input terminal of the NAND element 26 also goes into the "H" state, even though the p-channel transistor 23 is now in the OFF state. As a result, output from the NAND element 26 goes into the "L" state and the n-channel transistor 28 goes into the OFF state.

By the way, the common bit lines GBL1 through GBLp have been pulled up to the "H" level by resistors. Therefore, when the n-channel transistor 28 is in the OFF state, the common bit lines GBL1 through GBLp go into the "H" state.

Then one of the column switches CS1 through CSp which corresponds to a column from which data is to be read goes into the ON state and one of the p-channel transistors 30-1 through 30-p goes into the ON state. In this example, the p-channel transistor 30-1 corresponding to the memory cell C11 goes into the ON state and "H" read from the memory cell C11 will be output.

On the other hand, if data stored in the memory cell C11 is "L," then output from the NAND element 26 goes into the "H" state and the n-channel transistor 28 goes into the ON state. As a result, the common bit line GBL1 is grounded and goes into the "L" state. When the p-channel transistor 30-1 goes into the ON state, "L" will be read.

Data stored in a desired memory cell can be read in this way.

The structure of the embodiment shown in FIG. 1 differs from that of conventional semiconductor memory devices (see FIG. 18) in that the total number of the word lines is four. With conventional semiconductor memory devices, there is one word line for every memory cell. This structure of the embodiment shown in FIG. 1 simplifies the structure of the multiplexer 20, so time which elapses after an address signal being supplied to the multiplexer and before a word line being put into an active state can be shortened. As a result, the operation speeds of semiconductor memory devices can be improved.

Now, a second embodiment of the present invention will be described.

Figure 2:
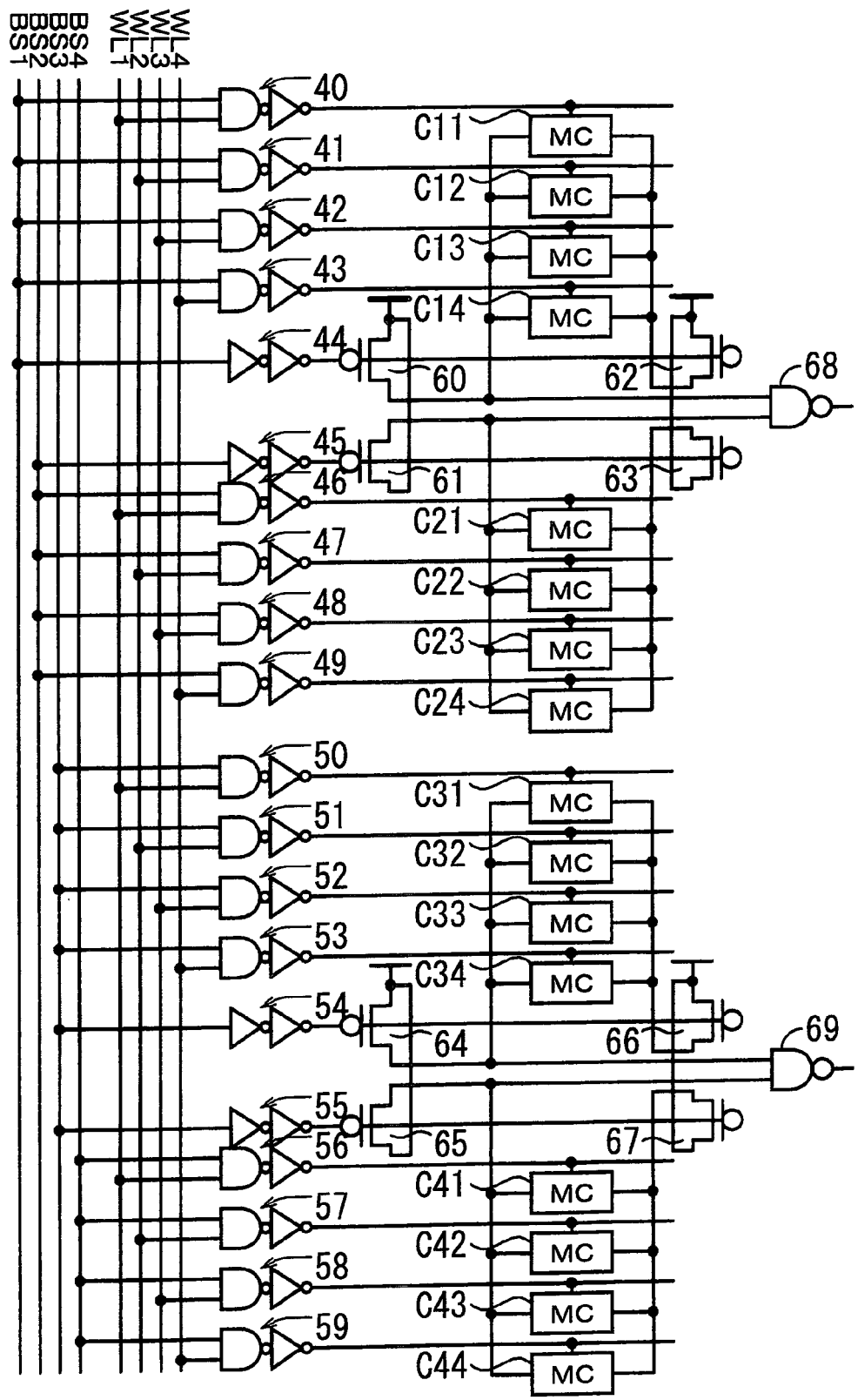
FIG. 2 is a view showing the structure of a second embodiment of the present invention.

FIG. 2 is a view showing the structure of a second embodiment of the present invention. The basic structure of the second embodiment is the same as that of the conventional semiconductor memory device shown in FIG. 18, so only the main portions of the second embodiment are shown in FIG. 2.

As shown in FIG. 2, the second embodiment of the present invention comprises memory cells C11 through C14, C21 through C24, C31 through C34, and C41 through C44, AND elements 40 through 43, 46 through 49, 50 through 53, and 56 through 59 each including a NAND element and inverter, buffers 44, 45, 54, and 55 each including two inverters, p-channel transistors 60 through 67, NAND elements 68 and 69.

The memory cells C11 through C14, C21 through C24, C31 through C34, and C41 through C44 form one column. Really, there are p columns of memory cells.

The AND elements 40 through 43 find the logical product of a local block selection signal BS1 output from a bank decoder 4 and a word line WL1 output from a word line driver 3, the logical product of the local block selection signal BS1 and a word line WL2 output from the word line driver 3, the logical product of the local block selection signal BS1 and a word line WL3 output from the word line driver 3, and the logical product of the local block selection signal BS1 and a word line WL4 output from the word line driver 3, respectively, and output a result obtained. The AND elements 46 through 49 find the logical product of a local block selection signal BS2 output from the bank decoder 4 and the word line WL1, the logical product of the local block selection signal BS2 and the word line WL2, the logical product of the local block selection signal BS2 and the word line WL3, and the logical product of the local block selection signal BS2 and the word line WL4, respectively, and output a result obtained. The AND elements 50 through 53 find the logical product of a local block selection signal BS3 output from the bank decoder 4 and the word line WL1, the logical product of the local block selection signal BS3 and the word line WL2, the logical product of the local block selection signal BS3 and the word line WL3, and the logical product of the local block selection signal BS3 and the word line WL4, respectively, and output a result obtained. The AND elements 56 through 59 find the logical product of a local block selection signal BS4 output from the bank decoder 4 and the word line WL1, the logical product of the local block selection signal BS4 and the word line WL2, the logical product of the local block selection signal BS4 and the word line WL3, and the logical product of the local block selection signal BS4 and the word line WL4, respectively, and output a result obtained.

The buffer 44 creates a delay corresponding to two logic elements in the local block selection signal BS1 and outputs it. The buffer 45 creates a delay corresponding to two logic elements in the local block selection signal BS2 and outputs it. The buffer 54 creates a delay corresponding to two logic elements in the local block selection signal BS3 and outputs it. The buffer 55 creates a delay corresponding to two logic elements in the local block selection signal BS4 and outputs it.

The p-channel transistors 60 and 62 are put into the ON or OFF state according to a signal from the buffer 44. The p-channel transistors 61 and 63 are put into the ON or OFF state according to a signal from the buffer 45. The p-channel transistors 64 and 66 are put into the ON or OFF state according to a signal from the buffer 54. The p-channel transistors 65 and 67 are put into the ON or OFF state according to a signal from the buffer 55. When the p-channel transistors 60 and 62, 61 and 63, 64 and 66, or 65 and 67 go into the ON state, they will pre-charge the corresponding local block.

The NAND element 68 inverts the logical product of a signal output from one of the memory cells C11 through C14 and a signal output from one of the memory cells C21 through C24 and outputs a result obtained.

The NAND element 69 inverts the logical product of a signal output from one of the memory cells C31 through C34 and a signal output from one of the memory cells C41 through C44 and outputs a result obtained.

A signal output from the NAND element 68 or 69 is supplied to a common bit line GBL1 via an n-channel transistor. This is the same with FIG. 1.

Now, operation in the above second embodiment will be described.

Descriptions will be given with a case where data is read from the memory cell C11 as an example. Before reading is begun, all of the local block selection signals BS1 through BS4 are in the "L" state. Therefore, signals output from the buffers 44, 45, 54, and 55 are all in the "L" state. As a result, all of the p-channel transistors 60 through 67 go into the ON state.

One terminal of each of the p-channel transistors 60 through 67 is connected to power supply. Therefore, when these transistors go into the ON state, a divided bit line (left-hand wiring connected to memory cells) and auxiliary divided bit line (right-hand wiring connected to the memory cells) included in the corresponding local block are pre-charged and go into the "H" state.

If a read address signal is input in this state of things, the word line WL1 and local block selection signal BS1 are put into the "H" state by the word line driver 3 and bank decoder 4 respectively. The other word lines and local block selection signals are put into the "L" state. As a result, output from the AND element 40 goes into the "H" state and a state in which a row including the memory cell C11 has been selected arises. Moreover, output from the buffer 44 goes into the "H" state, so the p-channel transistor 60 goes into the OFF state and a divided bit line and auxiliary divided bit line to which the memory cell C11 is connected are freed from a pre-charged state.

When the memory cell C11 is selected, data stored in it is output to the divided bit line. In this embodiment, only one memory cell is selected in the direction of a column, so data is not output from a memory cell in another local block. One input terminal of each of the NAND elements 68 and 69 has been pulled up to the "H" level. Therefore, if data stored in the memory cell C11 is "H," then "L" will be output from the NAND element 68. If data stored in the memory cell C11 is "L," then "H" will be output from the NAND element 68.

Operation performed after this is the same as that in FIG. 1, so descriptions of it will be omitted.

In the above embodiment, a signal for controlling the operation of pre-charging a divided bit line and auxiliary divided bit line and a signal for selecting a memory cell can be generated from the word lines WL1 through WL4 and local block selection signals BS1 through BS4 and an area where the word lines WL1 through WL4 are located is close to an area where the local block selection signals BS1 through BS4 are located. Therefore, an operation margin after a divided bit line and auxiliary divided bit line being freed from a pre-charged state and before a word line being selected can be minimized. As a result, semiconductor memory devices can operate at higher speeds.

Now, a third embodiment of the present invention will be described.

Figure 3:
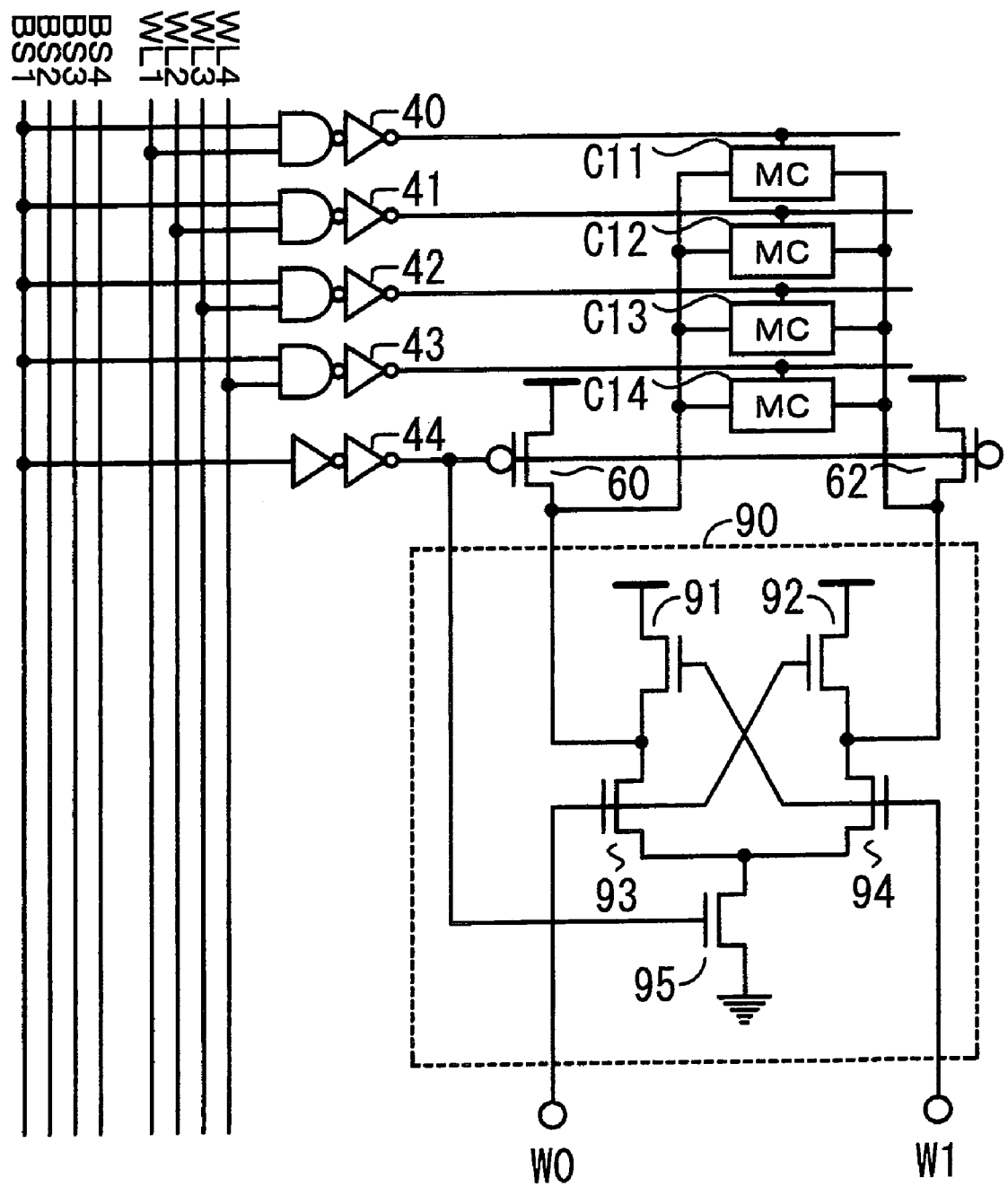
FIG. 3 is a view showing the structure of a third embodiment of the present invention.

FIG. 3 is a view for describing a third embodiment of the present invention. The basic structure of the third embodiment is the same as that of the conventional semiconductor memory device shown in FIG. 18, so only the main portions of the third embodiment are shown in FIG. 3. Moreover, part of FIG. 2 is extracted and is shown in FIG. 3, so common elements are marked with the same symbols.

The third embodiment comprises memory cells C11 through C14, AND elements 40 through 43 each including a NAND element and inverter, a buffer 44 including two inverters, p-channel transistors 60 and 62 included in a pre-charge circuit, and n-channel transistors 91 through 95 included in a write amplifier 90.

Now, operation in the above third embodiment of the present invention will be described.

Descriptions of operation performed when data is written into the memory cell C11 will be given. Before write operation is begun, local block selection signals BS1 through BS4 are all in the "L" state. Therefore, output from the buffer 44 is in the "L" state. As a result, both the p-channel transistors 60 and 62 go into the ON state and a divided bit line and auxiliary divided bit line are pre-charged by a power supply voltage and go into a pre-charged state.

When a write address is input, a local block selection signal BS1 output from a bank decoder 4 goes into the "H" state. As a result, output from the buffer 44 goes into the "H" state and the p-channel transistors 60 and 62 go into the OFF state. The pre-charging operation therefore is completed.

At this time WL1, being output from a word line driver 3, goes into the "H" state, so output from the AND element 40 goes into the "H" state. Therefore, a row including the memory cell C11 will be selected.

Output (a write enable signal) from the buffer 44 is in the "H" state. Therefore, in the write amplifier 90, the n-channel transistor 95 goes into the ON state and the sources (or drains) of the n-channel transistors 93 and 94 will be grounded.

If write signal lines W0 and W1 are in the "H" and "L" states respectively, then the n-channel transistors 93 and 94 go into the ON and OFF states respectively. Furthermore, the n-channel transistors 91 and 92 go into the OFF and ON states respectively.

As a result, the drain of the n-channel transistor 93 carries ground potential and the drain of the n-channel transistor 92 carries power supply potential. The divided bit line and auxiliary divided bit line therefore go into the "L" and "H" states respectively.

Signals sent to the divided bit line and auxiliary divided bit line are written into the memory cell C11 in this way.

When the writing of data is completed, the local block selection signal BS1 goes into the "L" state. As a result, output from the buffer 44 goes into the "L" state, the p-channel transistors 60 and 62 go into the ON state, and the divided bit line and auxiliary divided bit line go into a pre-charged state. Moreover, the word line WL1 goes into the "L" state, so the memory cell C11 goes into a non-selected state.

In the above embodiment, the timing of the operation of the write amplifier 90 is generated from the local block selection signals BS1 through BS4. Therefore, compared with a case where write enable signals are located separately, the number of wirings can be reduced, resulting in a reduction in the area of chips.

Furthermore, a signal for the timing of the operation of the write amplifier 90 is generated from the local block selection signals BS1 through BS4 and a signal for selecting a memory cell is generated from the word lines. An area where the local block selection signals BS1 through BS4 are located is adjacent to an area where the word lines are located. This prevents a timing lag caused by long wirings. In addition, as a result, a margin at the time of design can be set to a minimum value. This improves the speed at which memories operate.

Figure 4:
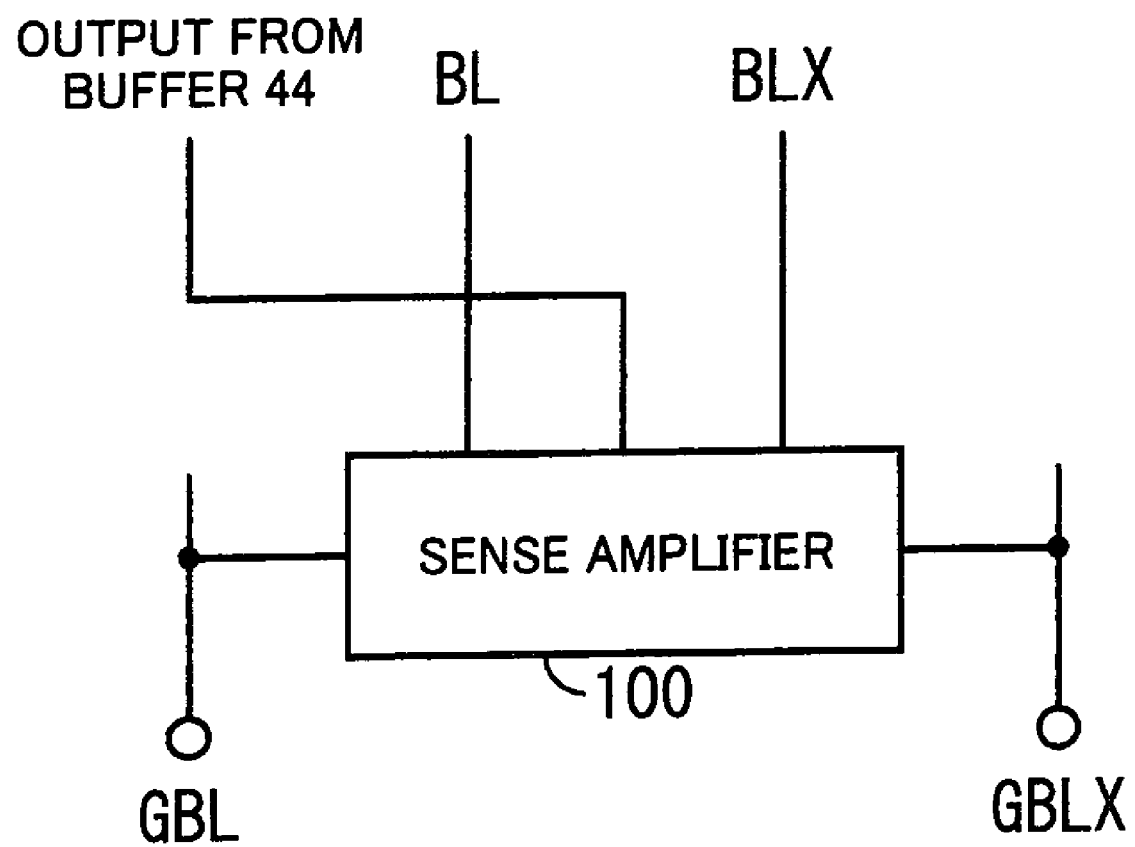
FIG. 4 is a view showing an example of the structure of a sense amplifier located in an area in FIG. 3 enclosed with a dashed line.

The embodiment using the write amplifier 90 has been described, but a sense amplifier 100 shown in FIG. 4 may be located.

A circuit shown in FIG. 4 will be located in an area in FIG. 3 enclosed with a dashed line. The sense amplifier 100 amplifies data output from a memory cell and outputs it. The common bit line GBL, the auxiliary common bit line GBLX, the divided bit line BL, the auxiliary divided bit line BLX, and an output line of the buffer 44 are connected to the sense amplifier 100.

Now, the operation of the above circuit will be described. It is assumed that data is read from the memory cell C11. In common with the above case, the local block selection signals BS1 through BS4 and word lines WL1 through WL4 are all in the "L" state before read operation is begun. Therefore, output from each of the AND elements 40 through 43 goes into the "L" state. As a result, the memory cells C11 through C14 are in a non-selected state. Moreover, output from the buffer 44 is in the "L" state. Therefore, the p-channel transistors 60 and 62 go into the ON state and the divided bit line BL and auxiliary divided bit line BLX go into a pre-charged state.

When an address signal is input, the bank decoder 4 puts the local block selection signal BS1 into the "H" state. Therefore, output from the buffer 44 goes into the "H" state, the p-channel transistors 60 and 62 go into the OFF state, and the pre-charge operation is stopped. Moreover, output from the AND element 40 goes into the "H" state. Therefore, the memory cell C11 is selected and data stored in the memory cell C11 is read and is output to the divided bit line BL and auxiliary divided bit line BLX.

When output from the buffer 44 goes into the "H" state, the sense amplifier 100 begins to operate, amplifies voltage supplied to the divided bit line BL and auxiliary divided bit line BLX, and supplies it to the common bit line GBL and auxiliary common bit line GBLX.

As a result, data stored in the memory cell C11 is read, is amplified, and then is output to the common bit line GBL and auxiliary common bit line GBLX.

In common with the above case where the write amplifier 90 is used, this can shorten a time lag between the timing with which the word lines become active and the timing with which the sense amplifier 100 begins to operate. As a result, by reducing a margin for the timing, the operation of the memory can be speeded up.

Figure 5:
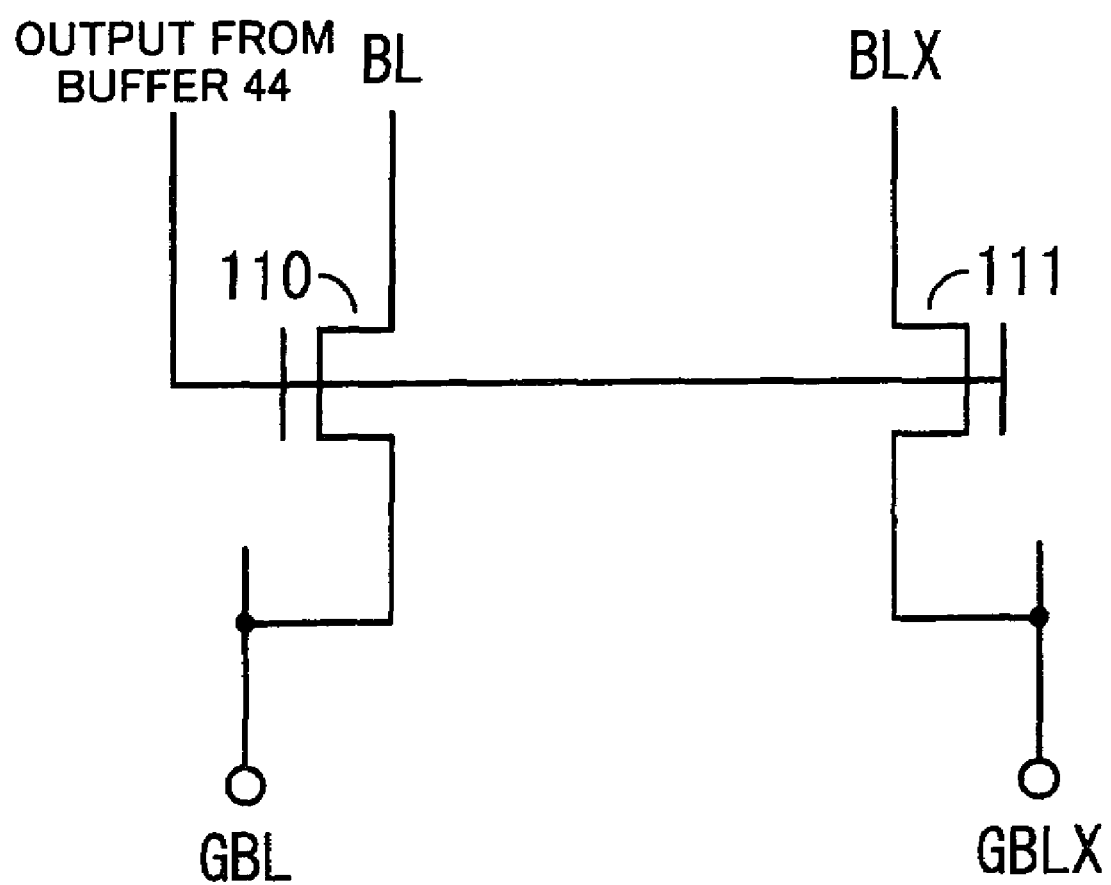
FIG. 5 is a view showing an example of the structure of a local block selection switching circuit located in the area in FIG. 3 enclosed with the dashed line.

The embodiment using the sense amplifier 100 has been described, but a local block selection switching circuit shown in FIG. 5 may be located.

In common with the above case, the circuit shown in FIG. 5 will be located in the area in FIG. 3 enclosed with the dashed line. The local block selection switching circuit includes n-channel transistors 110 and 111. The gates of the n-channel transistors 110 and 111 are connected to output from the buffer 44. The drains of the n-channel transistors 110 and 111 are connected to the divided bit line BL and auxiliary divided bit line BLX respectively. The sources of the n-channel transistors 110 and 111 are connected to the common bit line GBL and auxiliary common bit line GBLX respectively.

Now, the operation of the above circuit will be described. It is assumed that data is written into the memory cell C11. In common with the above case, the local block selection signals BS1 through BS4 and word lines WL1 through WL4 are all in the "L" state before write operation is begun. Therefore, output from each of the AND elements 40 through 43 goes into the "L" state. As a result, the memory cells C11 through C14 are in a non-selected state. Moreover, output from the buffer 44 is in the "L" state. Therefore, the p-channel transistors 60 and 62 go into the ON state and the divided bit line BL and auxiliary divided bit line BLX go into a pre-charged state.

When an address signal is input, the bank decoder 4 puts the local block selection signal BS1 into the "H" state. Therefore, output from the buffer 44 goes into the "H" state, the p-channel transistors 60 and 62 go into the OFF state, and the pre-charge operation is stopped. Moreover, output from the AND element 40 goes into the "H" state. Therefore, the memory cell C11 is selected and data stored in the memory cell C11 is read and is output to the divided bit line BL and auxiliary divided bit line BLX.

When output from the buffer 44 goes into the "H" state, the n-channel transistors 110 and 111 go into the ON state, the common bit line GBL and divided bit line BL are connected, and the auxiliary common bit line GBLX and auxiliary divided bit line BLX are connected. As a result, data can be written.

In common with the above case where the sense amplifier 100 is used, this can shorten a time lag between the timing with which the word lines become active and the timing with which the local block selection switching circuit begins to operate. As a result, by reducing a margin for the timing, the operation of the memory can be speeded up.

Now, a fourth embodiment of the present invention will be described.

Figure 6:
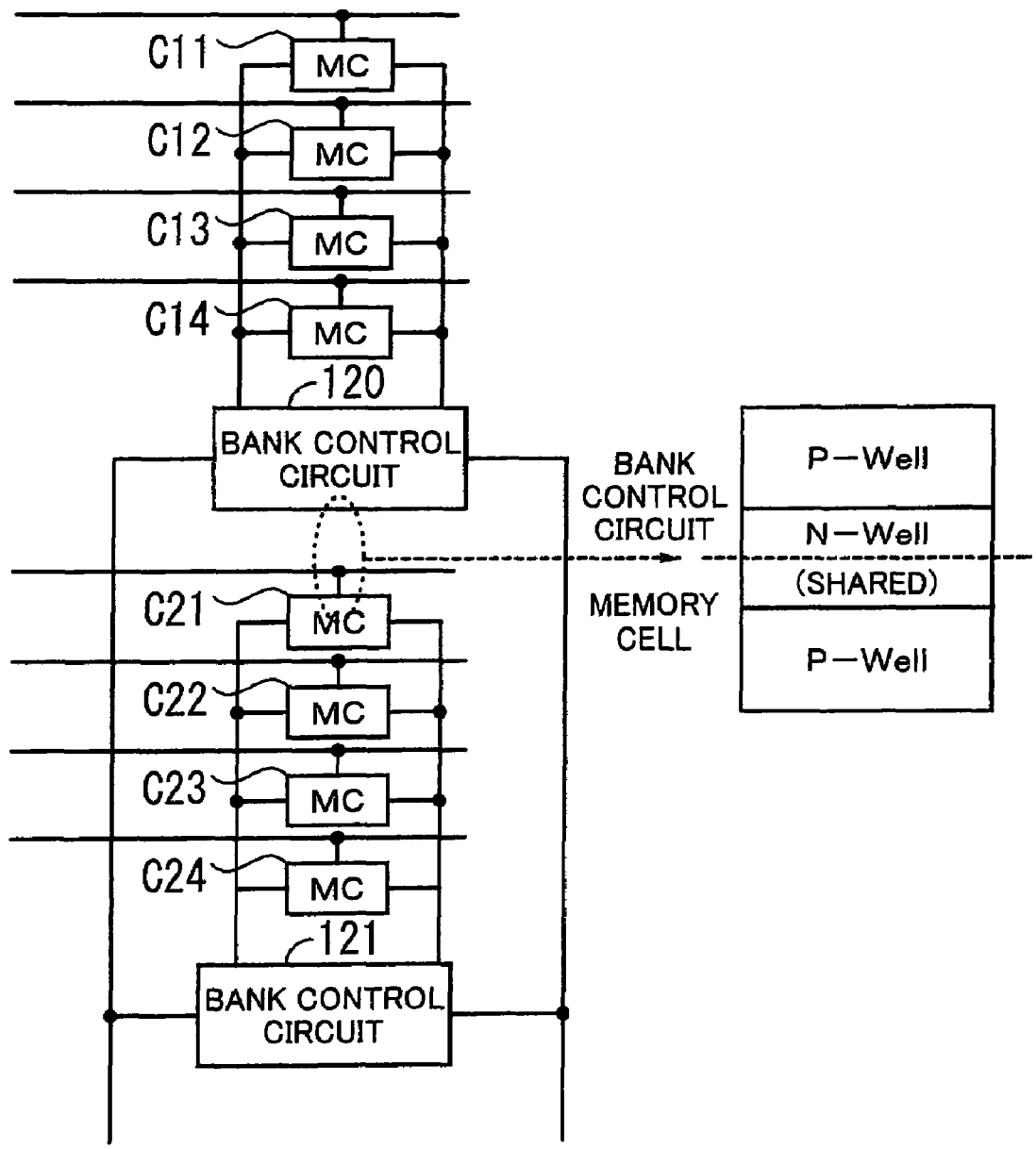
FIG. 6 is a view showing the structure of a fourth embodiment of the present invention.

FIG. 6 is a view showing the structure of a fourth embodiment of the present invention. In FIG. 6, the structure of an area where memory cells C11 through C14 and C21 through C24 are located is shown. A bank control circuit 120 controls the memory cells C11 through C14. A bank control circuit 121 controls the memory cells C21 through C24.

As shown on the right side of FIG. 6, the memory cell C21 partially shares an n-well with the bank control circuit 120. A p-well included in the bank control circuit 120 is located on the shared n-well and a p-well included in the memory cell C21 is located beneath the shared n-well.

Usually a buffer area is formed between the memory cell C21 and bank control circuit 120. However, if an n-well is shared in this way by the memory cell C21 and bank control circuit 120, there is no need to form this buffer area. As a result, the area of a chip can be reduced by an area corresponding to this buffer area.

Now, a fifth embodiment of the present invention will be described.

Figure 7:
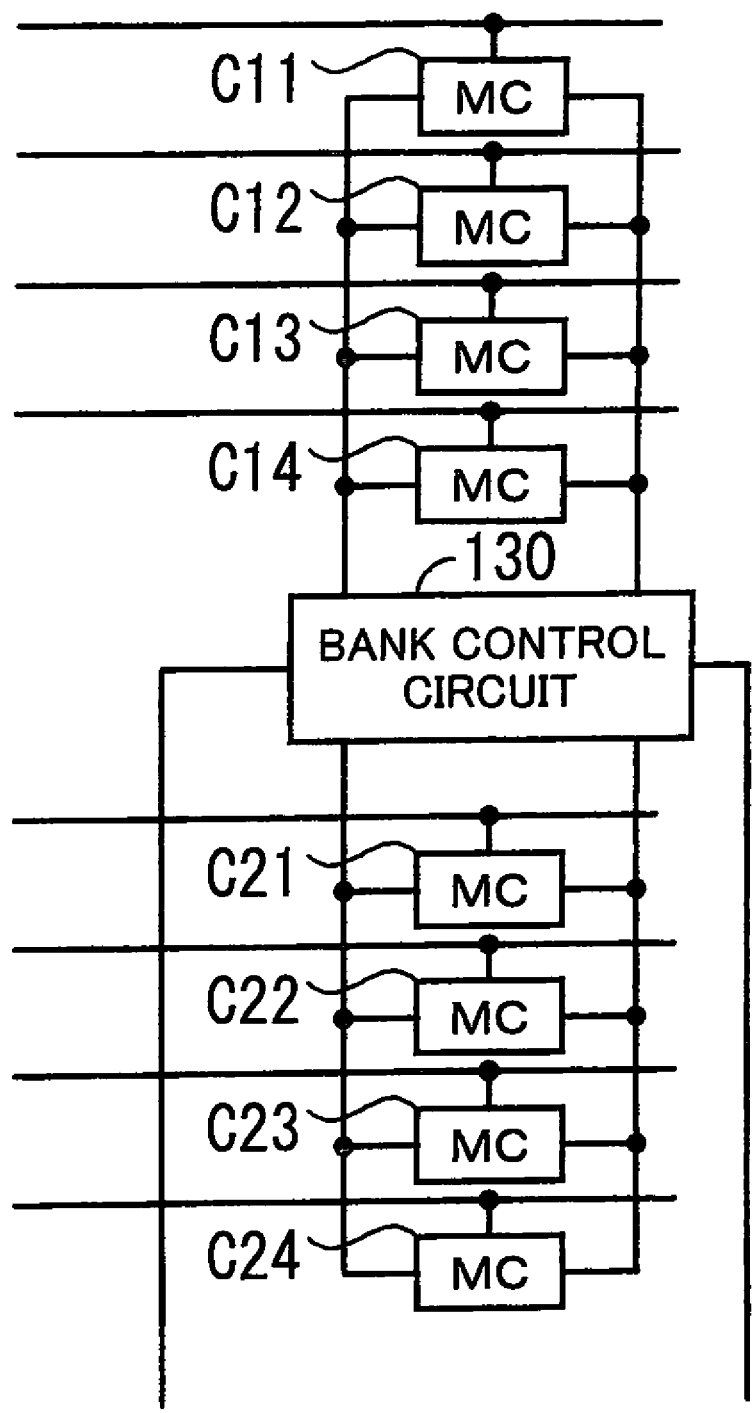
FIG. 7 is a view showing the structure of a fifth embodiment of the present invention.

FIG. 7 is a view for describing a fifth embodiment of the present invention. In FIG. 7, the structure of an area regarding memory cells C11 through C14 and C21 through C24 is shown. A bank control circuit 130 controls the memory cells C11 through C14 located on it and the memory cells C21 through C24 located beneath it.

Therefore, compared with conventional semiconductor memory devices, the area of a chip can be reduced by one bank control circuit controlling local blocks, which are located on and beneath it, in this way.

In this embodiment, the structure shown in FIG. 6 can be adopted. That is to say, the bank control circuit 130 can partially share a well with the memory cells C21 and C14. By doing so, the area of a chip can be reduced further.

The p-channel transistors 22 and 23, NAND element 26, and n-channel transistor 28 shown in FIG. 1 can be given as a concrete example of circuit structure used in the fifth embodiment.

Now, a sixth embodiment of the present invention will be described.

Figure 8:
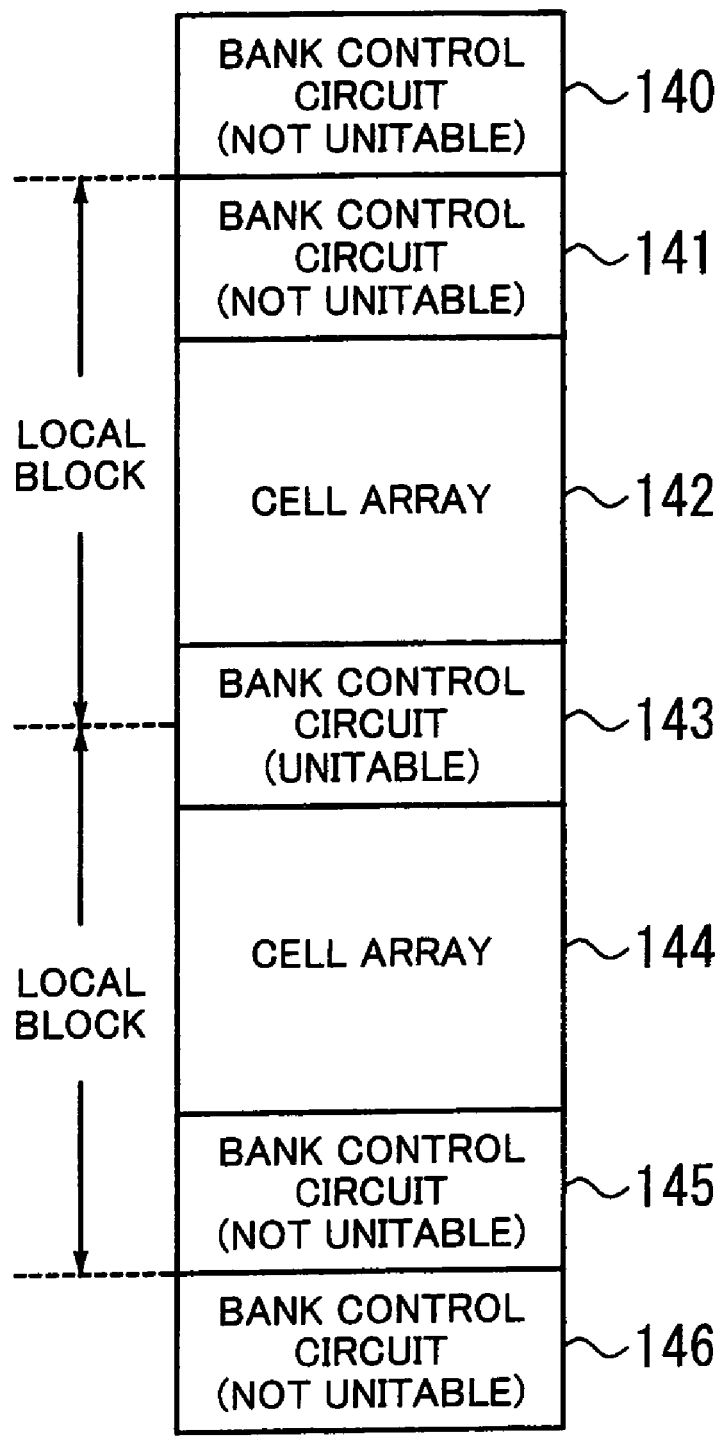
FIG. 8 is a view showing the structure of a sixth embodiment of the present invention.

FIG. 8 is a view showing how cell arrays and bank control circuits are located. In this example, bank control circuits 140 and 141, a cell array 142, a bank control circuit 143, a cell array 144, and bank control circuits 145 and 146 are located. The bank control circuit 141, the cell array 142, and the upper half of the bank control circuit 143 form one local block and the lower half of the bank control circuit 143, the cell array 144, and the bank control circuit 145 form another local block.

The bank control circuit 143 includes, for example, the p-channel transistors 22 and 23, NAND element 26, and n-channel transistor 28 shown in FIG. 1. Each of the bank control circuits 140, 141, 145, and 146 is a pre-charge circuit including, for example, the buffer 44 and p-channel transistors 60 and 62 shown in FIG. 2.

As shown in FIG. 8, bank control circuits between the cell arrays 142 and 144 can be united into one. This is the same with the case of FIG. 7. In this example, two bank control circuits are united into the bank control circuit 143. On the other hand, the bank control circuit 141 located on the cell array 142 and the bank control circuit 140 located on the bank control circuit 141 cannot be united into one, so these bank control circuits are located separately from each other. However, the pre-charge circuits included in these bank control circuits partially share an n-well. Therefore, in common with the above case, there is no need to form a buffer area. As a result, by adopting this arrangement, the area of a chip can be reduced further.

As described above, in the sixth embodiment of the present invention, two bank control circuits located between cell arrays are united into one and bank control circuits, which cannot be united into one and which include the same well, are located contiguously to each other. As a result, a buffer area can be eliminated and the area of a chip can be reduced.

Now, a seventh embodiment of the present invention will be described.

Figure 9:
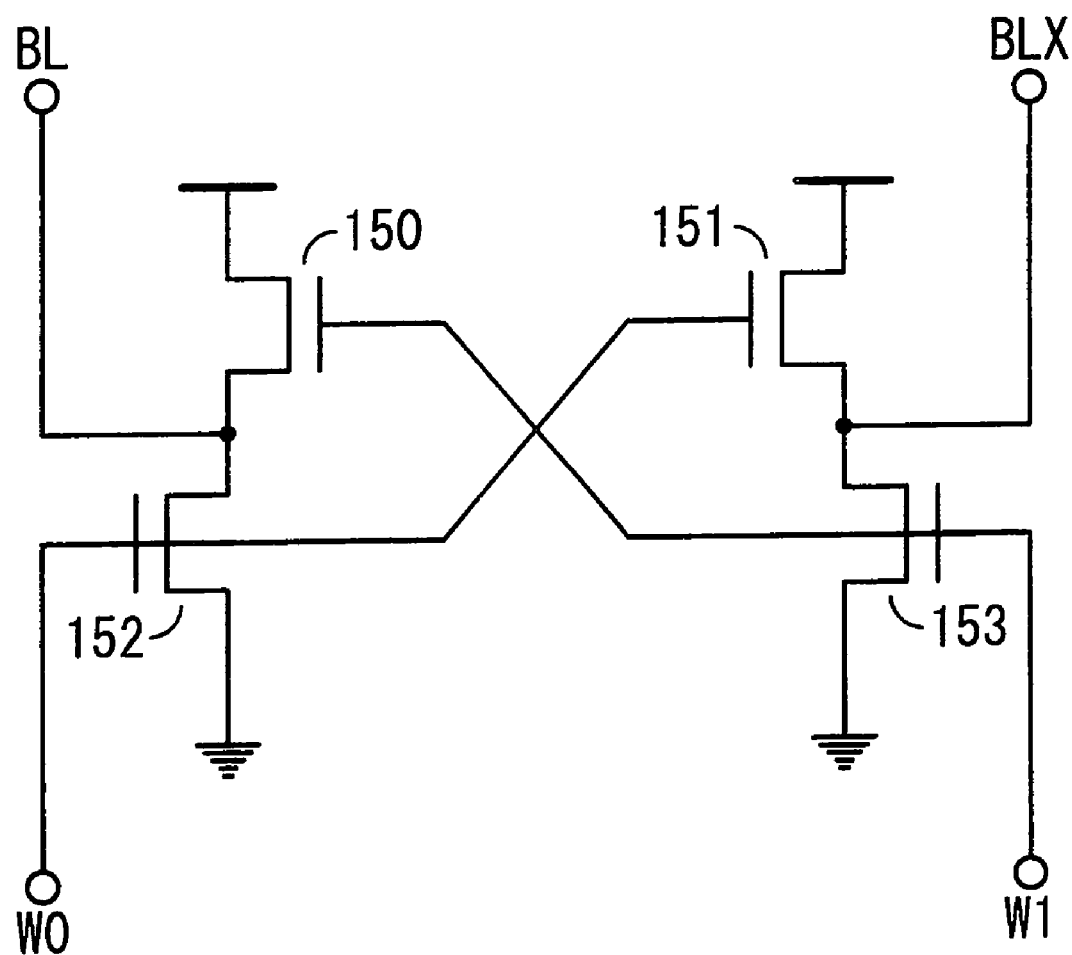
FIG. 9 is a view showing the structure of a seventh embodiment of the present invention.

FIG. 9 is a view for describing a seventh embodiment of the present invention. In FIG. 9, the structure of a write amplifier is shown. The write amplifier according to this embodiment includes n-channel transistors 150 through 153. The source of the n-channel transistor 152 is grounded, its drain is connected to a divided bit line BL and the source of the n-channel transistor 150, and its gate is connected to a write signal line W0. The drain of the n-channel transistor 150 is connected to power supply, its source is connected to the divided bit line BL and the drain of the n-channel transistor 152, and its gate is connected to a write signal line W1.

The source of the n-channel transistor 153 is grounded, its drain is connected to an auxiliary divided bit line BLX and the source of the n-channel transistor 151, and its gate is connected to the write signal line W1. The drain of the n-channel transistor 151 is connected to the power supply, its source is connected to the auxiliary divided bit line BLX and the drain of the n-channel transistor 153, and its gate is connected to the write signal line W0.

Now, the operation of the above embodiment will be described.

It is assumed that the write signal line W0 is in the "H" state and that the write signal line W1 is in the "L" state. In that case, the n-channel transistors 152 and 151 go into the ON state and the n-channel transistors 153 and 150 go into the OFF state. As a result, the divided bit line BL is grounded and therefore goes into the "L" state. The auxiliary divided bit line BLX is connected to the power supply and therefore goes into the "H" state. That is to say, a signal obtained by inverting the logic of the signal applied to the write signal line W0 will be output to the divided bit line BL. Similarly, a signal obtained by inverting the logic of the signal applied to the write signal line W1 will be output to the auxiliary divided bit line BLX.

Figure 10:
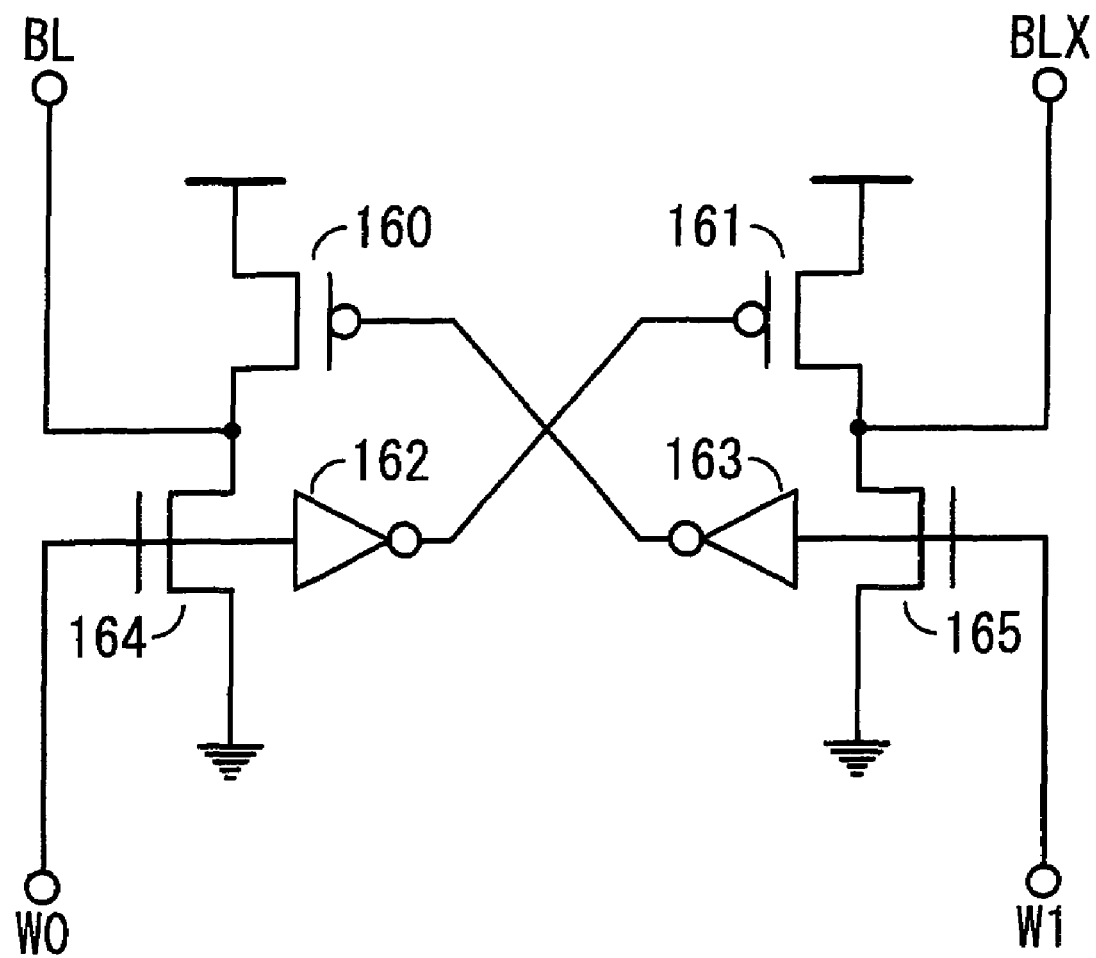
FIG. 10 is a view showing an example of the structure of a conventional write amplifier.

FIG. 10 is a view showing an example of the structure of a conventional write amplifier. In this example, the conventional write amplifier includes p-channel transistors 160 and 161, inverters 162 and 163, and n-channel transistors 164 and 165. The operation of this conventional write amplifier is the same as that of the write amplifier shown in FIG. 9.

FIGS. 9 and 10 show the following. In this embodiment, the inverters 162 and 163 can be eliminated and a write amplifier can be made only of n-channel transistors. This obviates the need to locate a buffer area for separating different wells. As a result, the area of a chip can be reduced.

Now, an eighth embodiment of the present invention will be described.

Figure 11:
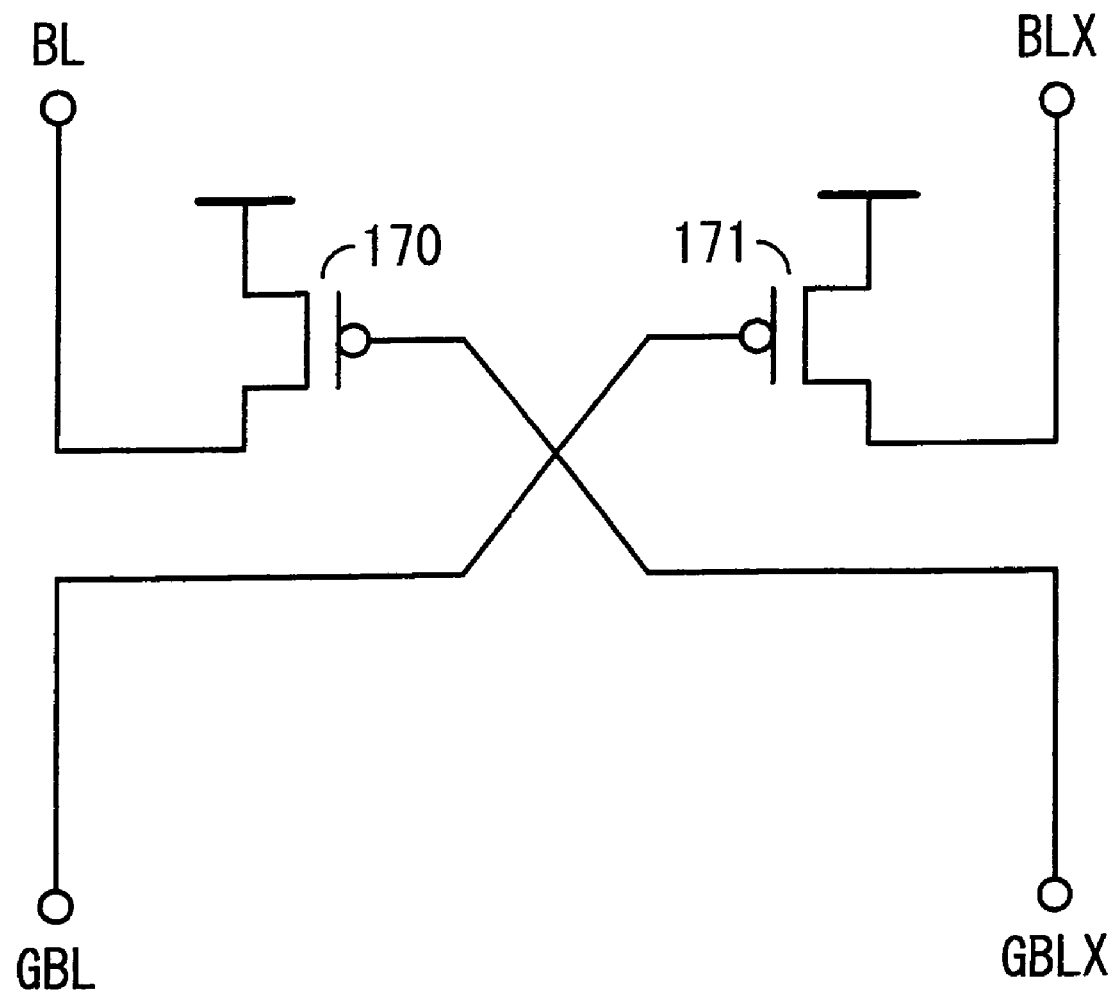
FIG. 11 is a view showing the structure of an eighth embodiment of the present invention.

FIG. 11 is a view for describing an eighth embodiment of the present invention. In FIG. 11, the structure of a write error protection circuit is shown. This write error protection circuit includes p-channel transistors 170 and 171. The source of the p-channel transistor 170 is connected to power supply, its drain is connected to a divided bit line BL, and its gate is connected to an auxiliary common bit line GBLX.

The source of the p-channel transistor 171 is connected to the power supply, its drain is connected to an auxiliary divided bit line BLX, and its gate is connected to a common bit line GBL.

Now, the operation of the above embodiment will be described. It is assumed that "H" is applied to the common bit line GBL and that "L" is applied to the auxiliary common bit line GBLX. Then the gate of the p-channel transistor 170 goes into the "L" state, so the p-channel transistor 170 goes into the ON state and the divided bit line BL goes into the "H" state. On the other hand, the gate of the p-channel transistor 171 goes into the "H" state, so the p-channel transistor 171 goes into the OFF state and the auxiliary divided bit line BLX goes into the "L" state. Therefore, the signal applied to the common bit line GBL will be output to the divided bit line BL with its logic left as it was. Similarly, the signal applied to the auxiliary common bit line GBLX will be output to the auxiliary divided bit line BLX with its logic left as it was. At that time "H" will be leveled up to a power supply voltage, so a write error caused by a decrease in signal level can be prevented.

As shown in FIG. 11, the write error protection circuit having a simple structure can be made by causing signals input to the p-channel transistors 170 and 171 to cross.

Now, a ninth embodiment of the present invention will be described.

Figure 12:
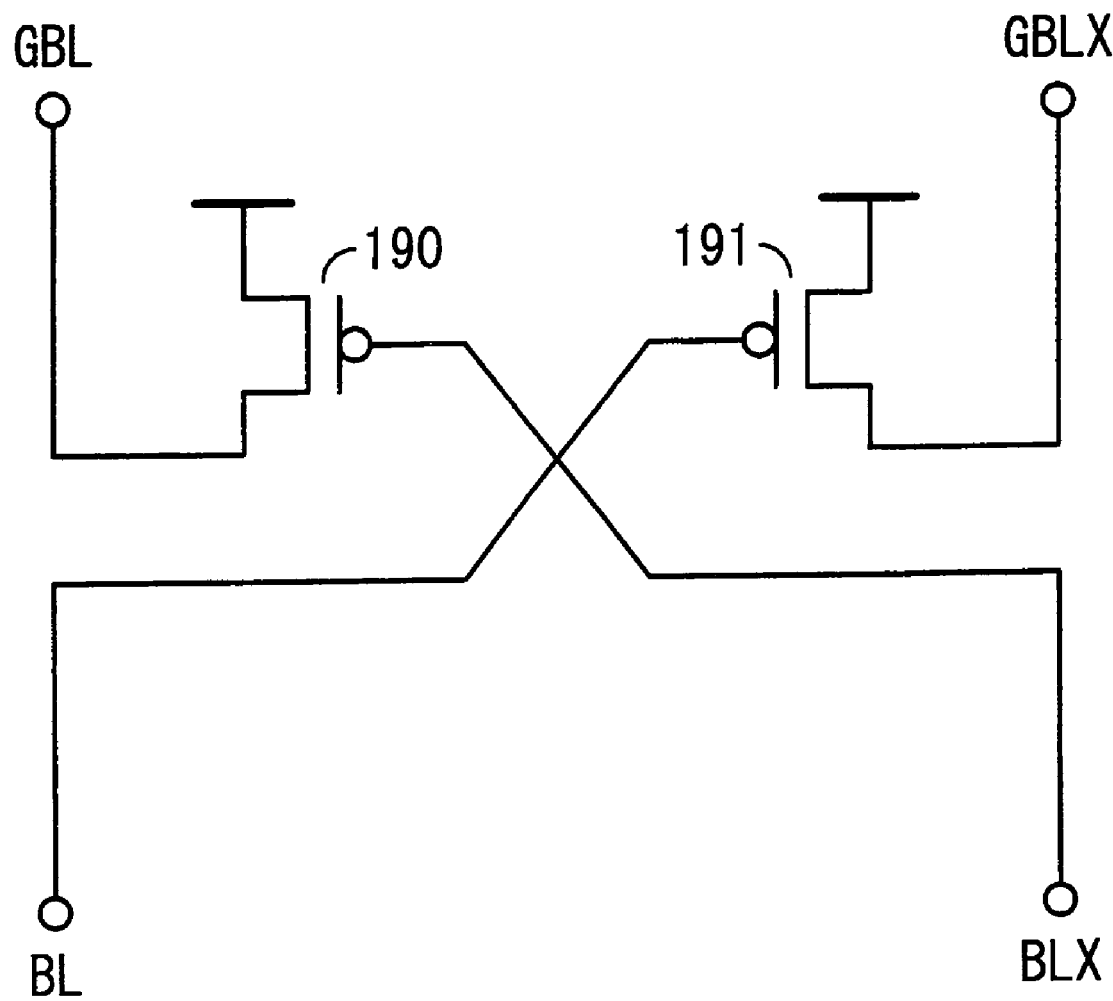
FIG. 12 is a view showing the structure of a ninth embodiment of the present invention.

FIG. 12 is a view for describing a ninth embodiment of the present invention. In FIG. 12, the structure of a read error protection circuit is shown. This read error protection circuit includes p-channel transistors 190 and 191.

The source of the p-channel transistor 190 is connected to power supply, its drain is connected to a common bit line GBL, and its gate is connected to an auxiliary divided bit line BLX.

The source of the p-channel transistor 191 is connected to the power supply, its drain is connected to an auxiliary common bit line GBLX, and its gate is connected to a divided bit line BL.

Now, the operation of the above embodiment will be described. It is assumed that "H" is output from a memory cell to the divided bit line BL and that "L" is output from the memory cell to the auxiliary divided bit line BLX. Then the gate of the p-channel transistor 190 goes into the "L" state, so the p-channel transistor 190 goes into the ON state and the common bit line GBL goes into the "H" state. On the other hand, the gate of the p-channel transistor 191 goes into the "H" state, so the p-channel transistor 191 goes into the OFF state and the auxiliary common bit line GBLX goes into the "L" state. Therefore, the signal applied to the divided bit line BL will be output to the common bit line GBL with its logic left as it was. Similarly, the signal applied to the auxiliary divided bit line BLX will be output to the auxiliary common bit line GBLX with its logic left as it was. At that time "H" will be leveled up to a power supply voltage, so a read error caused by a decrease in signal level can be prevented.

As shown in FIG. 12, the read error protection circuit having a simple structure can be made by causing signals input to the p-channel transistors 190 and 191 to cross.

Now, a tenth embodiment of the present invention will be described.

Figure 13:
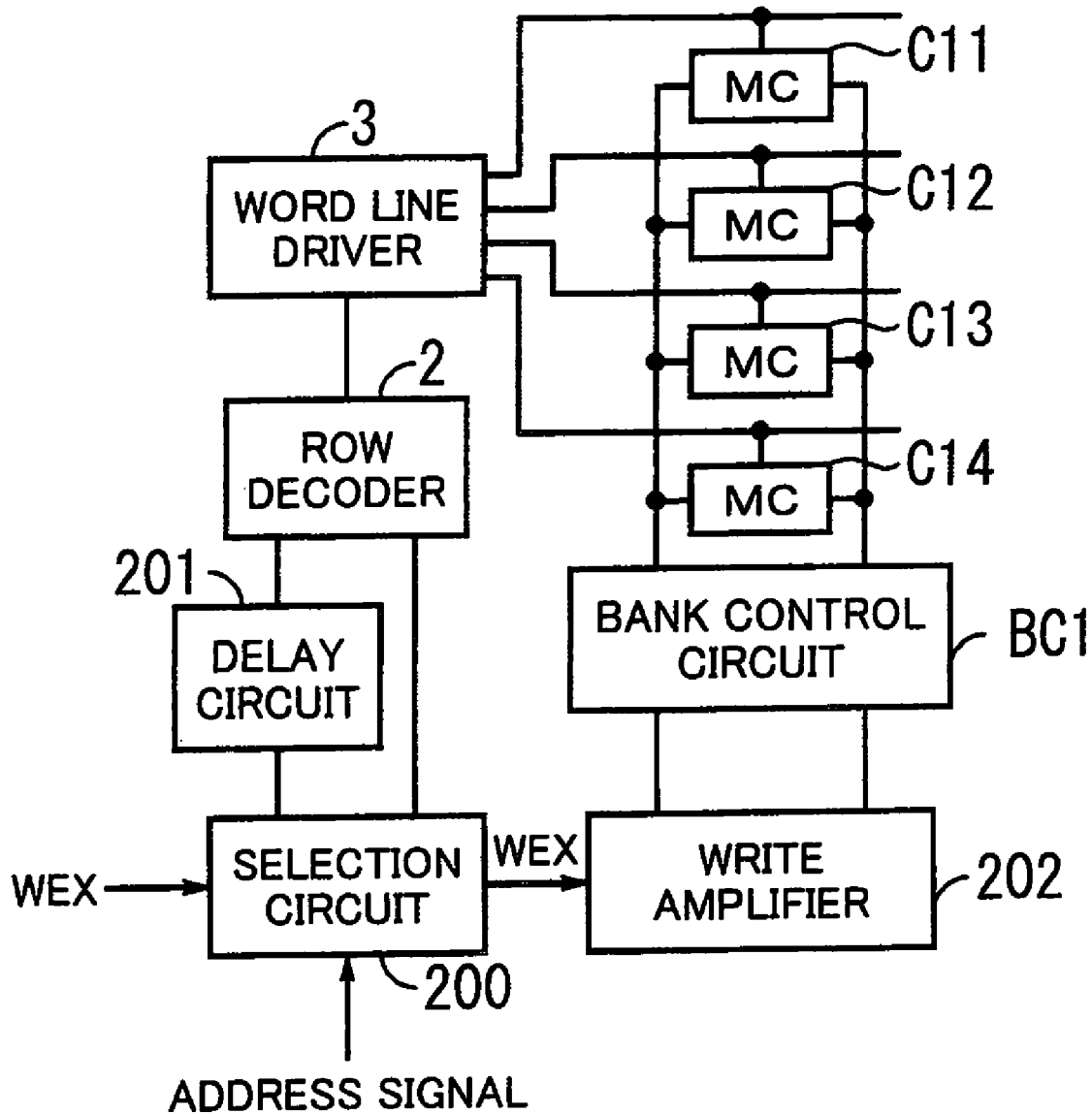
FIG. 13 is a view showing the structure of a tenth embodiment of the present invention.

FIG. 13 is a view for describing a tenth embodiment of the present invention. In FIG. 13, only elements regarding memory cells C11 through C14 are shown.

As shown in FIG. 13, the tenth embodiment of the present invention comprises the memory cells C11 through C14, a bank control circuit BC1, a write amplifier 202, a selection circuit 200, a delay circuit 201, a row decoder 2, and a word line driver 3.

Each of the memory cells C11 through C14 stores data and outputs it at need.

Figure 18:
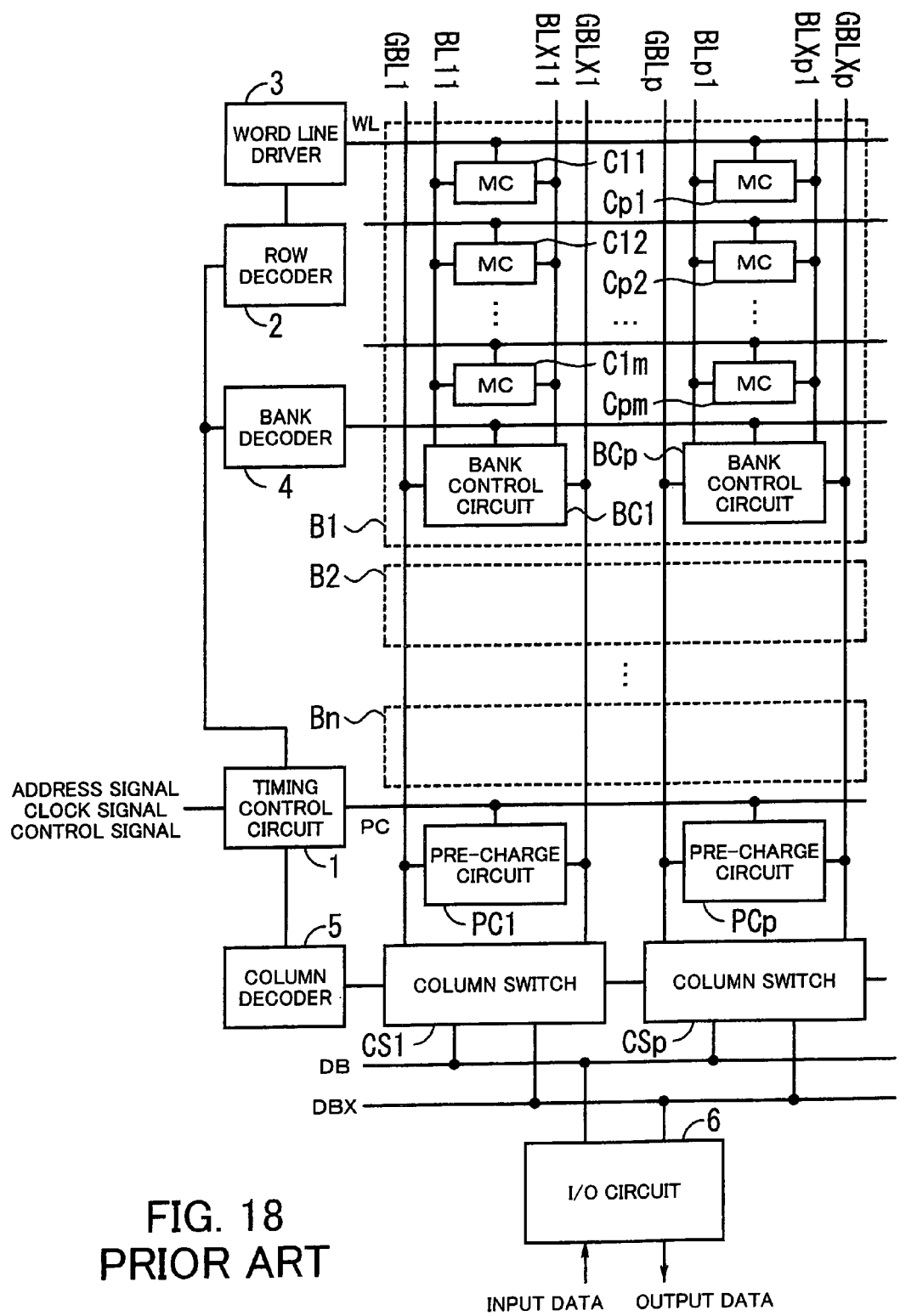
FIG. 18 is a view showing the structure of a conventional semiconductor memory device.

The bank control circuit BC1 controls a local block in compliance with a control signal output from the bank decoder 4 shown in FIG. 18.

The write amplifier 202 amplifies the voltage of a write signal when data is written into the memory cells C11 through C14.

The selection circuit 200 supplies an address signal to the delay circuit 201 when an inverted write enable signal WEX is active. The selection circuit 200 supplies an address signal to the row decoder 2 when the inverted write enable signal WEX is inactive.

The row decoder 2 decodes an address signal supplied from the delay circuit 201 or the selection circuit 200 and controls the word line driver 3 according to the result.

The word line driver 3 selects a word line under the control of the row decoder 2.

Now, operation in the above embodiment will be described. An overview of operation in a conventional semiconductor memory device and the tenth embodiment of the present invention will be given first with reference to FIGS. 14 and 15, and then concrete operation in the tenth embodiment of the present invention shown in FIG. 13 will be described.

Figure 14:
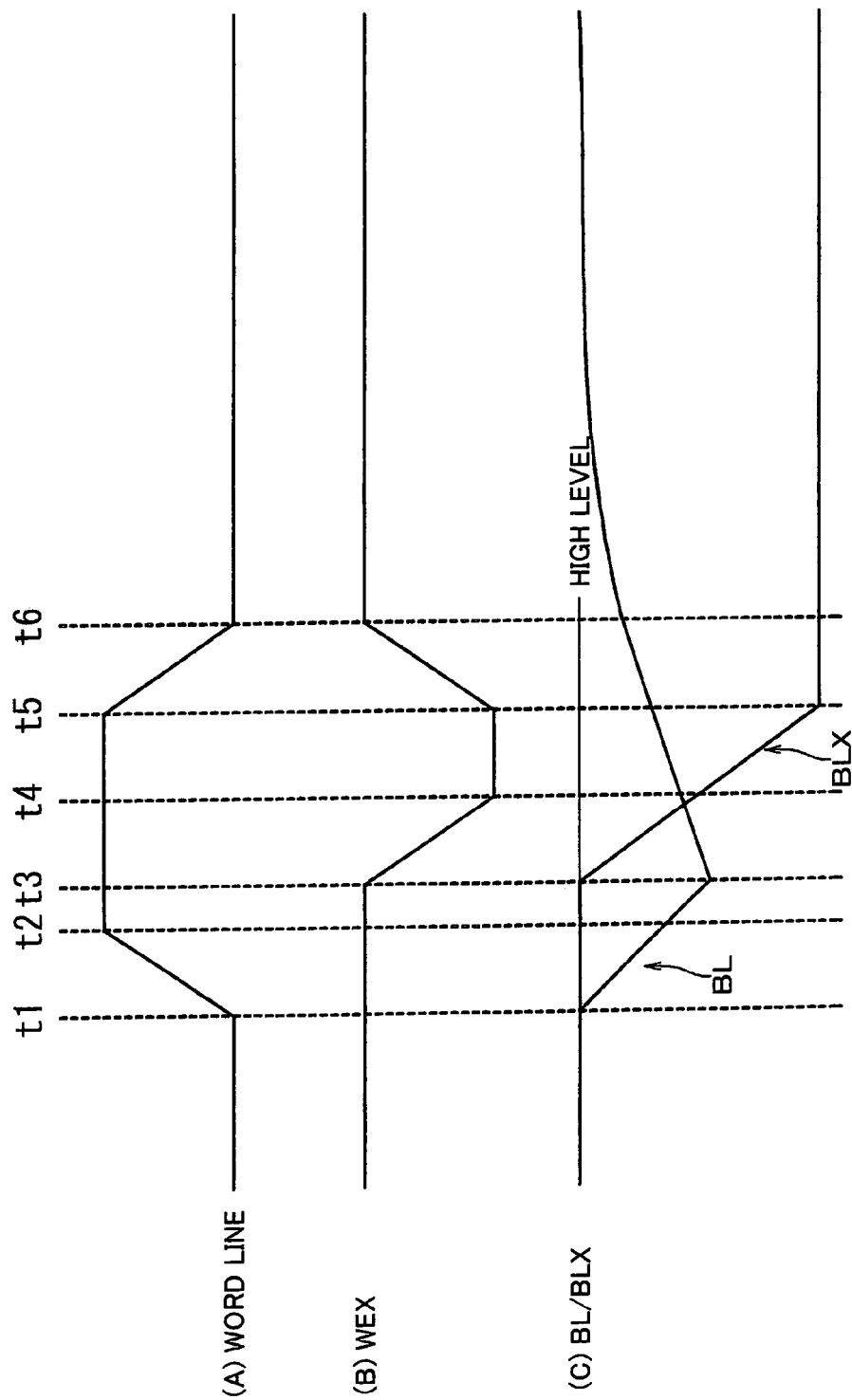
FIG. 14 is a view for describing the operation of a conventional circuit at the time of writing.

FIG. 14 is a view for describing the operation of a conventional circuit at the time of writing. In this example, it is assumed that "L" and "H" are now stored on the divided bit line BL side and auxiliary divided bit line BLX side, respectively, of a memory cell and that "H" and "L" will be written on the divided bit line BL side and auxiliary divided bit line BLX side, respectively, of the memory cell.

As shown in FIG. 14(C), the BL/BLX are both in the "H" state up to time t1 as a result of pre-charge operation. A word line is put into the "H" state at time t1. At this time the data is output from the memory cell. The divided bit line BL side of the memory cell is in the "L" state, so voltage begins to drop gradually. On the other hand, the auxiliary divided bit line BLX side of the memory cell is in the "H" state, so voltage remains constant.

At time t3 an inverted write enable (WEX) signal goes into an active state. As shown in FIG. 14(B), at this time an inverted write enable voltage begins to drop gradually.

The logic of data to be written into the memory cell is opposite to that of the data which is now stored in it, so the divided bit line BL side will be rewritten from "L" to "H" and the auxiliary divided bit line BLX side will be rewritten from "H" to "L."

Therefore, the divided bit line BL gradually changes to the "H" state from time t3 when the inverted write enable (WEX) signal goes into an active state. On the other hand, the auxiliary divided bit line BLX begins to change to the "L" state at time t3.

The divided bit line BL or the auxiliary divided bit line BLX changes from the "H" state to the "L" state more rapidly than from the "L" state to the "H" state, so its voltage will change from the "L" state to the "H" state with an easier gradient than from the "H" state to the "L" state. As a result, the divided bit line BL is not completely in the "H" state at time t6 when the inverted write enable (WEX) signal goes into an inactive state. The reversion of the "H" and "L" levels occurs between time t3 and t4. However, the "H" level of the device is dropping, so a malfunction will probably not occur.

At the time of design, a margin must be set on the assumption that these cases are possible. As a result, a largish margin must be set, which makes it impossible to speed up write operation. Therefore, the tenth embodiment of the present invention shown in FIGS. 13 and 15 solves these problems by delaying timing at the time of write operation with which a word line is put into an active state. An overview of this operation will now be given.

In this example, a case where "L" and "H" are now stored on the divided bit line BL side and auxiliary divided bit line BLX side, respectively, of a memory cell and where "H" and "L" will be written on the divided bit line BL side and auxiliary divided bit line BLX side, respectively, of the memory cell will be described. This is the same with the case of FIG. 14.

As shown in FIG. 15(A), a word line is put into the "H" state at time t3. An inverted write enable (WEX) signal goes into an active state the moment the word line goes into the "H" state (see FIG. 15(B)).

The data "H" is now stored on the auxiliary divided bit line BLX side of the memory cell and the data "L" is to be written there. Therefore, as shown in FIG. 15(C), the voltage of the auxiliary divided bit line BLX drops. On the other hand, the data "L" is now stored on the divided bit line BL side of the memory cell and the data "H" is to be written there. Therefore, as shown in FIG. 15(C), the voltage of the divided bit line BL once drops to charge the memory cell, then rises, and then reaches the "H" level at time t5 (see FIG. 15(C)).

As stated above, in this embodiment, timing at the time of write operation with which a signal on a word line is put into an active state is delayed. This prevents a malfunction from being caused in a device.

Now, operation in the embodiment shown in FIG. 13 will be described. Descriptions will be given with a case where data is written into a memory cell C11 as an example.

If data is written, an inverted write enable signal goes into the "L" state. When an address signal is input to the selection circuit 200, the selection circuit 200 supplies the address signal to the delay circuit 201.

Figure 15:
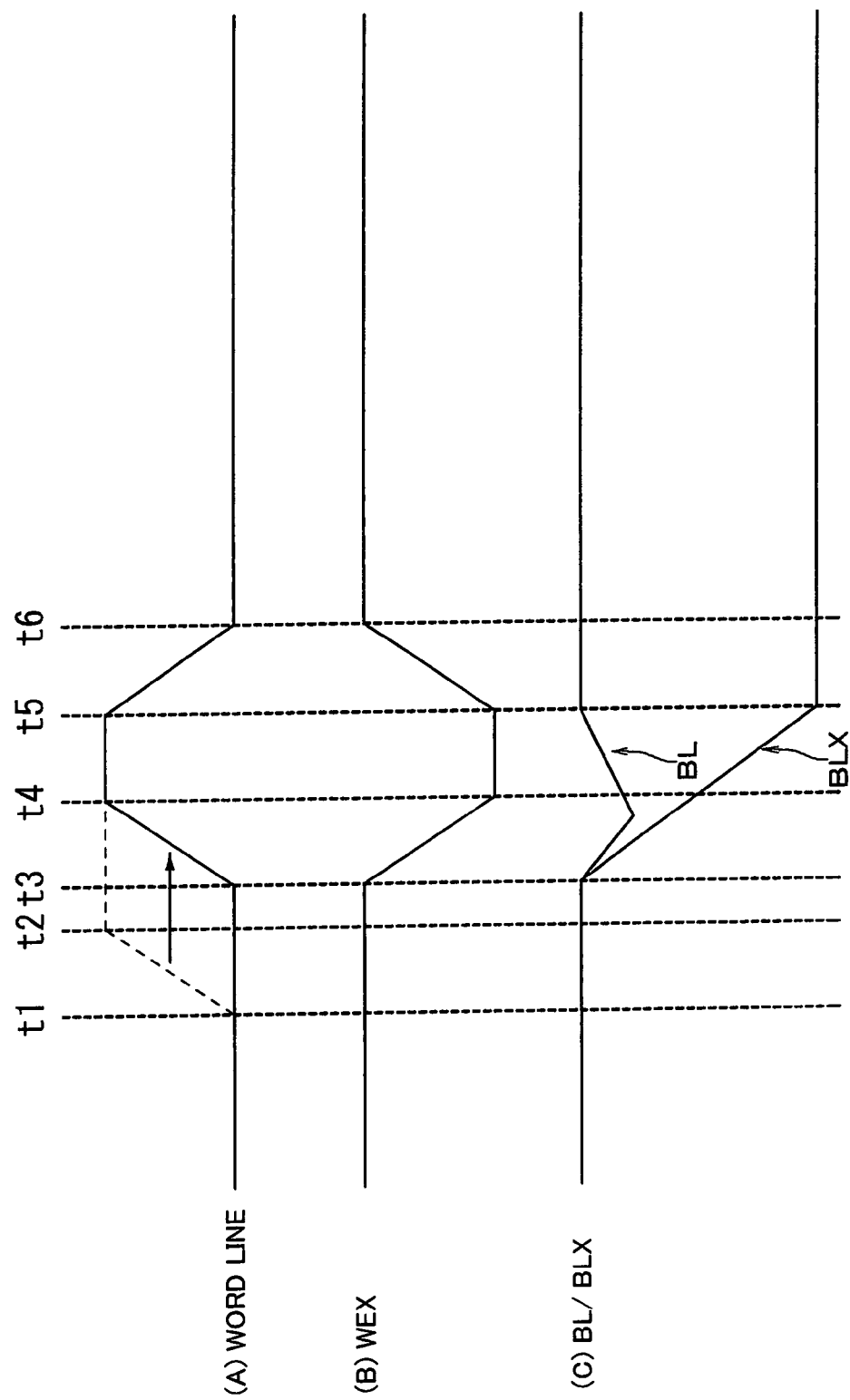
FIG. 15 is a timing chart for describing operation in the embodiment shown in FIG. 13.

The delay circuit 201 delays the address signal supplied from the selection circuit 200 by predetermined time (time which corresponds to (t3−t1) shown in FIG. 15) and supplies it to the row decoder 2.

The row decoder 2 decodes the address signal supplied from the delay circuit 201 and controls the word line driver 3 according to the result.

As a result, a word line connected to the memory cell C11 goes into an active state after the delay produced by the delay circuit 201 and the memory cell C11 is selected.

At this time the bank control circuit BC1 has been selected by the bank decoder 4 (the bank control circuit BC1 has been put into the ON state according to the inverted write enable signal), so the data supplied from the write amplifier 202 is supplied to the memory cell C11 and is written there.

As described above, in the tenth embodiment of the present invention, timing at the time of write operation with which a word line is put into an active state is delayed by predetermined time by the delay circuit 201. This prevents a device malfunction.

Furthermore, time for which an inverted write enable signal is in an active state can be shortened. As a result, the operation of writing data into a semiconductor memory device can be speeded up.

Now, an eleventh embodiment of the present invention will be described.

Figure 16:
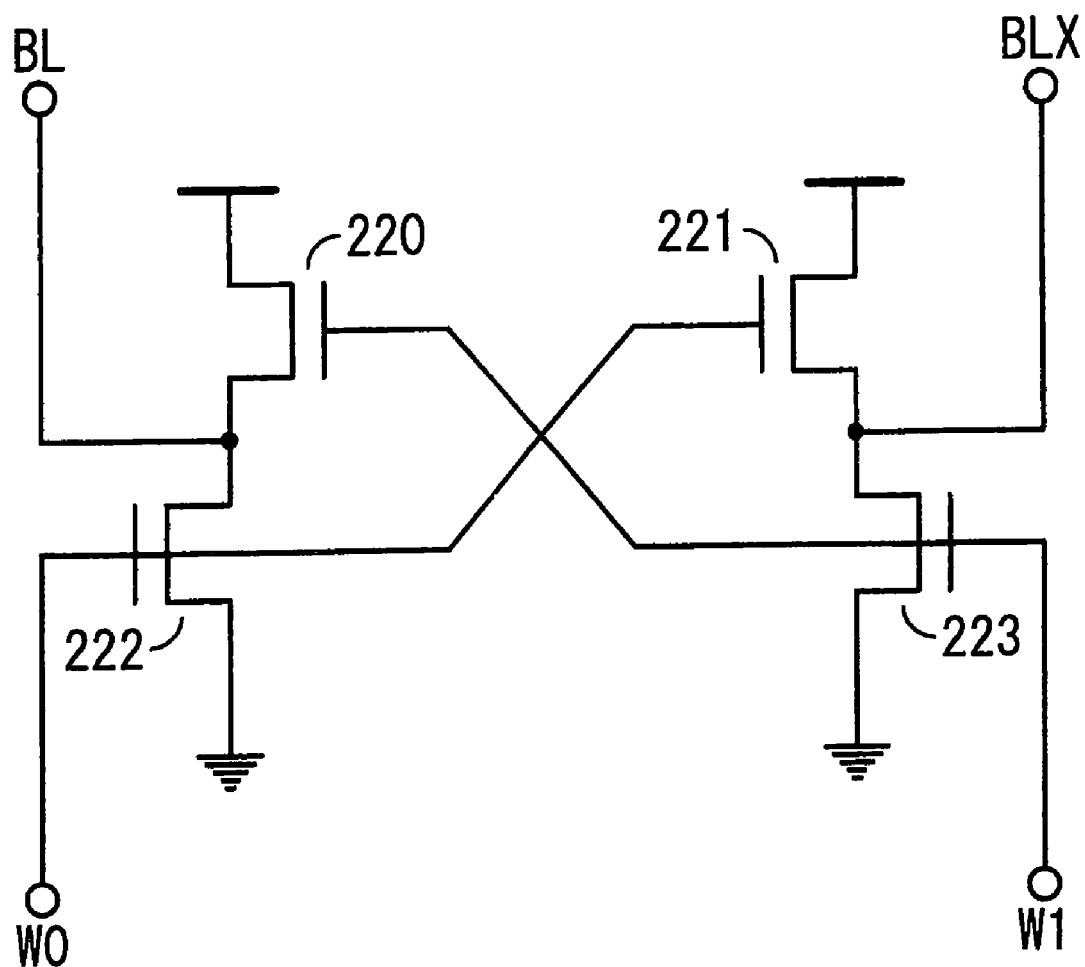
FIG. 16 is a view showing the structure of an eleventh embodiment of the present invention.

FIG. 16 is a view showing the structure of an eleventh embodiment of the present invention. In FIG. 16, a write amplifier is shown. The write amplifier shown in FIG. 16 includes n-channel transistors 220 through 223.

The drain of the n-channel transistor 220 is connected to power supply, its source is connected to the divided bit line BL and the drain of the n-channel transistor 222, and its gate is connected to a write signal line W1.

The drain of the n-channel transistor 221 is connected to the power supply, its source is connected to the auxiliary divided bit line BLX and the drain of the n-channel transistor 223, and its gate is connected to a write signal line W0.

The source of the n-channel transistor 222 is grounded, its drain is connected to the divided bit line BL, and its gate is connected to the write signal line W0.

The source of the n-channel transistor 223 is grounded, its drain is connected to the auxiliary divided bit line BLX, and its gate is connected to the write signal line W1.

Compared with the write amplifier shown in FIG. 3, a transistor corresponding to the n-channel transistor 95 is omitted from the write amplifier according to this embodiment.

Now, the operation of the above embodiment will be described.

FIG. 17 is a view for describing the operation of the embodiment shown in FIG. 16. As shown in FIG. 17, in the case of data being written, each of the write signal lines W0 and W1 is put into the "H" or "L" state according to the data to be written. For example, it is assumed that the write signal line W0 is in the "H" state and that the write signal line W1 is in the "L" state. Then the n-channel transistor 222 goes into the ON state and the n-channel transistor 220 goes into the OFF state. The divided bit line BL therefore goes into the "L" state. On the other hand, the n-channel transistor 223 goes into the OFF state and the n-channel transistor 221 goes into the ON state. The auxiliary divided bit line BLX therefore goes into the "H" state.

As shown in FIG. 17, in the case of data being read, both the write signal lines W0 and W1 are put into the "L" state and all the n-channel transistors 220 through 223 go into the OFF state. As a result, the write amplifier goes into a high-impedance state and therefore goes into a state in which it is disconnected from the divided bit line BL and auxiliary divided bit line BLX.

In the above embodiment, in the case of data being read, both the write signal lines W0 and W1 are put into the "L" state and the write amplifier is disconnected from the circuit. As a result, compared with the case of FIG. 3, the n-channel transistor 95 and write enable signal line can be omitted. Therefore, by simplifying a circuit, the area of a chip can be reduced.

The above circuits shown as the first through eleventh embodiments are simple examples and it is a matter of course that the scope of the present invention is not limited to these cases.

As has been described in the foregoing, a semiconductor memory device in which memory cells arranged in a column direction are divided into a plurality of local blocks and in which data is read or written by the local block, according to the present invention, comprises word lines shared by part or all of the plurality of local blocks arranged in the column direction, a first selection circuit for controlling the word lines to select predetermined memory cells one at a time from each local block, a second selection circuit for selecting one predetermined local block from the plurality of local blocks which are arranged in the column direction and which share the word lines, and a third selection circuit for selecting a predetermined local block from a plurality of local blocks which are arranged in a row direction and which are selected by the second selection circuit. As a result, by simplifying a logic circuit for selecting a word line, timing with which a word line is selected can be speeded up.

Moreover, a semiconductor memory device in which memory cells arranged in a column direction are divided into a plurality of local blocks and in which data is read or written by the local block, according to the present invention, comprises a first group of selection lines arranged parallel to the column direction for selecting a predetermined local block from the plurality of local blocks arranged in the column direction, a second group of selection lines arranged parallel to the column direction for selecting a predetermined memory cell included in each local block, and a first selection circuit for selecting a predetermined memory cell from a plurality of memory cells included in a column by performing a logical operation on appropriate wirings among the first group of selection lines and the second group of selection lines. As a result, by simplifying a logic circuit for selecting a memory cell, timing with which a memory cell is selected can be speeded up.

Furthermore, a semiconductor memory device in which memory cells arranged in a column direction are divided into a plurality of local blocks comprises control circuits located according to the local blocks for controlling the memory cells to read or write data and each of the control circuits shares the same well with an adjacent memory cell. This obviates the need to form a buffer area. As a result, the area of a chip can be reduced by an area corresponding to a buffer area.

Furthermore, in a semiconductor memory device in which memory cells arranged in a column direction are divided into a plurality of local blocks and in which data is read or written by the local block, according to the present invention, two adjacent local blocks arranged in the column direction form a pair of local blocks and a control circuit is located in the center of two local blocks included in each pair of local blocks to control both the two local blocks. As a result, two control circuits can be united into one. Therefore, the area of a chip can be reduced by an area corresponding to an unnecessary control circuit.

Furthermore, in a semiconductor memory device in which memory cells arranged in a column direction are divided into a plurality of local blocks and in which data is read or written by the local block, according to the present invention, each local block has a write amplifier circuit for writing data into a memory cell which includes a first transistor, to an input terminal of which a first write signal line is connected, a first output terminal of which is grounded, and a second output terminal of which is connected to a first terminal of a memory cell included in the local block, a second transistor, to an input terminal of which a second write signal line is connected, a first output terminal of which is grounded, and a second output terminal of which is connected to a second terminal of a memory cell included in the local block, a third transistor, a first output terminal of which is connected to the second output terminal of the first transistor, a second output terminal of which is connected to power supply, and an input terminal of which is connected to the input terminal of the second transistor, and a fourth transistor, a first output terminal of which is connected to the second output terminal of the second transistor, a second output terminal of which is connected to the power supply, and an input terminal of which is connected to the input terminal of the first transistor. As a result, by simplifying a write amplifier circuit, the area of a chip can be reduced.

Furthermore, in a semiconductor memory device in which memory cells arranged in a column direction are divided into a plurality of local blocks and in which data is read or written by the local block, according to the present invention, each local block has a write error protection circuit for preventing a write error from occurring in the case of data being written into a memory cell which includes a first transistor, to an input terminal of which an auxiliary common bit line for reading data from or writing data into a local block included in each column is connected, to a first output terminal of which a main connection line of a memory cell included in the local block is connected, and to a second output terminal of which power supply is connected, and a second transistor, to an input terminal of which a main common bit line for reading data from or writing data into a local block included in each column is connected, to a first output terminal of which an auxiliary connection line of a memory cell included in the local block is connected, and to a second output terminal of which the power supply is connected. As a result, by simplifying the structure of a write error protection circuit, the area of a chip can be reduced.

Furthermore, a semiconductor memory device in which memory cells arranged in a column direction are divided into a plurality of local blocks and in which data is read or written by the local block, according to the present invention, comprises a write enable signal generation circuit for generating a write enable signal to indicate timing with which data is written into a memory cell and a memory cell selection signal generation circuit for generating a memory cell selection signal to select a memory cell from which data is to be read or into which data is to be written and, in the case of writing, the memory cell selection signal generation circuit generates a memory cell selection signal with timing different from timing in the case of reading. This prevents erroneous data from being written into a memory cell.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor memory device in which memory cells arranged in a column direction are divided into a plurality of local blocks, in which data is read or written by the local block, and in which each local block has a write error protection circuit for preventing a write error from occurring in the case of data being written into a memory cell, the write error protection circuit including:

a first transistor to an input terminal of which an auxiliary common bit line for reading data from or writing data into a local block included in each column is connected, to a first output terminal of which a main connection line of a memory cell included in the local block is connected, and to a second output terminal of which power supply is connected; and a second transistor to an input terminal of which a main common bit line for reading data from or writing data into a local block included in each column is connected, to a first output terminal of which an auxiliary connection line of a memory cell included in the local block is connected, and to a second output terminal of which the power supply is connected.

* * * * *